US009117934B2

(12) United States Patent
Rosenblatt et al.

(10) Patent No.: US 9,117,934 B2
(45) Date of Patent: Aug. 25, 2015

(54) ELECTROMECHANICAL DEVICES AND METHODS FOR FABRICATION OF THE SAME

(75) Inventors: Sami Rosenblatt, White Plains, NY (US); James Hone, New York, NY (US); Changyao Chen, New York, NY (US)

(73) Assignee: The Trustees of Columbia University In The City of New York, New York, NY (US)

( * ) Notice: Subject to any disclaimer, the term of this patent is extended or adjusted under 35 U.S.C. 154(b) by 896 days.

(21) Appl. No.: 13/149,415

(22) Filed: May 31, 2011

(65) Prior Publication Data
US 2012/0206012 A1 Aug. 16, 2012

Related U.S. Application Data

(63) Continuation-in-part of application No. PCT/US2009/066217, filed on Dec. 1, 2009.

(60) Provisional application No. 61/118,919, filed on Dec. 1, 2008.

(51) Int. Cl.
*H03B 5/30* (2006.01)
*H01L 29/86* (2006.01)
(Continued)

(52) U.S. Cl.
CPC ............ *H01L 29/86* (2013.01); *B81C 1/00142* (2013.01); *H01L 29/16* (2013.01); *H01L 29/1606* (2013.01); *H01L 29/84* (2013.01); *H01L 51/0045* (2013.01); *H03B 5/30* (2013.01)

(58) Field of Classification Search
CPC ..... B81B 1/00142; H01L 29/84; H01L 29/16; H01L 29/1606; H01L 29/0669; H01L 29/775; H01L 51/0045; H01L 51/0048; H01L 51/0058; H01L 29/86; C01B 31/0438; B82B 1/002; B82B 3/0085; B82B 3/009; H03B 5/30
USPC ............ 333/186, 197, 200; 257/24, 288, 347, 257/E51.006, E51.038; 977/720, 721, 724, 977/733, 734, 742, 750, 755, 762, 767, 932, 977/936–938, 953
See application file for complete search history.

(56) References Cited

U.S. PATENT DOCUMENTS 5,514,543 A 5/1996 Grossman et al.
5,591,312 A 1/1997 Smalley
(Continued)

FOREIGN PATENT DOCUMENTS

WO WO 2007/030423 A2 * 3/2007
WO WO 2008/049122 A2 * 4/2008

OTHER PUBLICATIONS

Gomez-Navarro et al.; "Elastic Properties of Chemically Derived Single Graphene Sheets"; Nano Letters vol. 8, No. 7, pp. 2045-2049, published online Jun. 10, 2008.*
(Continued)

*Primary Examiner* — Barbara Summons
(74) *Attorney, Agent, or Firm* — Baker Botts L.L.P.

(57) ABSTRACT

A fabricated electromechanical device is disclosed herein. An exemplary device includes, a substrate, at least one layer of a high-transconductance material separated from the substrate by a dielectric medium, a first electrode in electrical contact with the at least one layer of a high-transconductance material and separated from the substrate by at least one first supporting member, a second electrode in electrical contact with the layer of a high-transconductance material and separated from the substrate by at least one second supporting member, where the first electrode is electrically separate from the second electrode, and a third electrode separated from the at least one layer of high-transconductance material by a dielectric medium and separated from each of the first electrode and the second electrode by a dielectric medium.

22 Claims, 25 Drawing Sheets

(51) Int. Cl.
| | |
|---|---|
| H01L 51/00 | (2006.01) |
| B81C 1/00 | (2006.01) |
| H01L 29/16 | (2006.01) |
| H01L 29/84 | (2006.01) |

(56) References Cited

U.S. PATENT DOCUMENTS

| | | | | |
|---|---|---|---|---|
| 5,830,539 | A | 11/1998 | Yan et al. | |
| 6,472,962 | B1 | 10/2002 | Guo et al. | |
| 6,538,892 | B2 | 3/2003 | Smalc | |
| 6,803,840 | B2* | 10/2004 | Hunt et al. | 333/186 |
| 7,015,142 | B2 | 3/2006 | DeHeer et al. | |
| 7,705,617 | B1* | 4/2010 | Hersam et al. | 324/719 |
| 7,714,386 | B2* | 5/2010 | Pesetski et al. | 257/347 |
| 7,838,809 | B2* | 11/2010 | Ludwig | 250/214 A |
| 7,928,432 | B2 | 4/2011 | Nuckolls et al. | |
| 7,932,792 | B2* | 4/2011 | Kaunisto et al. | 333/186 |
| 7,947,581 | B2 | 5/2011 | Ma | |
| 7,948,042 | B2* | 5/2011 | Lau et al. | 257/415 |
| 7,965,156 | B2* | 6/2011 | Ward et al. | 333/186 |
| 8,120,448 | B2* | 2/2012 | Peng et al. | 333/186 |
| 8,168,964 | B2* | 5/2012 | Hiura et al. | 257/9 |
| 8,487,296 | B2* | 7/2013 | Grebel et al. | 257/20 |
| 8,659,009 | B2* | 2/2014 | Ozyilmaz et al. | 257/40 |
| 2002/0172963 | A1 | 11/2002 | Kelley et al. | |
| 2003/0098640 | A1 | 5/2003 | Kishi et al. | |
| 2003/0157733 | A1 | 8/2003 | Polanyi et al. | |
| 2004/0043527 | A1 | 3/2004 | Bradley et al. | |
| 2004/0181630 | A1* | 9/2004 | Jaiprakash et al. | 711/127 |
| 2005/0264466 | A1 | 12/2005 | Hibino et al. | |
| 2006/0183278 | A1 | 8/2006 | Bertin et al. | |
| 2006/0197076 | A1* | 9/2006 | Adam | 257/25 |
| 2006/0199399 | A1 | 9/2006 | Muscat | |
| 2006/0237805 | A1* | 10/2006 | Segal et al. | 257/414 |
| 2006/0255790 | A1* | 11/2006 | Gaillard et al. | 324/76.41 |
| 2006/0257657 | A1 | 11/2006 | Curran et al. | |
| 2007/0045756 | A1* | 3/2007 | Chang et al. | 257/414 |
| 2007/0053168 | A1 | 3/2007 | Sayir et al. | |
| 2007/0187694 | A1 | 8/2007 | Pfeiffer | |
| 2007/0235826 | A1 | 10/2007 | Jaiprakash et al. | |
| 2008/0079027 | A1 | 4/2008 | Bertin et al. | |
| 2008/0204152 | A1* | 8/2008 | Feng et al. | 331/34 |
| 2008/0261342 | A1* | 10/2008 | Zhou | 438/49 |
| 2009/0139752 | A1* | 6/2009 | Miyazaki et al. | 174/256 |
| 2010/0271003 | A1* | 10/2010 | Jensen et al. | 324/76.49 |
| 2011/0042687 | A1 | 2/2011 | Chu et al. | |
| 2011/0115090 | A1 | 5/2011 | Lin | |
| 2012/0021918 | A1* | 1/2012 | Bashir et al. | 506/2 |

OTHER PUBLICATIONS

Du et al.; "Approaching Ballistic Transport in Suspended Graphene"; Nature Nanotechnology Letters, pp. 1-5, published online Jul. 20, 2008.*
V. Ryzhii et al.; "Current-Voltage Characteristics of Graphene-Nanoribbon Field-Effect Transistor"; Journal of Applied Physics 103, (2008), pp. 094510-1 to 094510-8, published online May 7, 2008.*
Ouyang et al.; "Scaling Behaviors of Graphene Nanoribbon FETs: A Three-Dimensional Quantum Simulation Study"; IEEE Transactions on Electron Devices, vol. 54, No. 9, Sep. 2007, pp. 2223-2231.*
Li et al.; "Carbon Nanotube GHz Nano-Resonator"; 2004 IEEE MTT-S International Microwave Symposium Digest, vol. 2, pp. 987-990, Jun. 6-11, 2004.*
Wang et al.; "Room-Temperature All-Semiconducting Sub-10-nm Graphene Nanoribbon Field-Effect Transistors"; Physical Review Letters, PRL 100, 206803 (2008), pp. 206803-1 to 206803-4, published May 20, 2008.*
Lemme et al.; "A Graphene Field-Effect Device"; IEEE Electron Device Letters, vol. 28, No. 4, Apr. 2007, pp. 282-284.*
U.S. Appl. No. 12/955,310, Mar. 11, 2013, Amendment and Request for Continued Examination (RCE).
U.S. Appl. No. 12/955,310, Sep. 10, 2012, Final Office Action.
U.S. Appl. No. 12/955,310, Jul. 13, 2012, Response to Non-Final Office Action.
U.S. Appl. No. 12/955,310, Mar. 13, 2012, Non-Final Office Action.
U.S. Appl. No. 12/955,310, Feb. 22, 2012, Response to Restriction Requirement.
U.S. Appl. No. 12/955,310, Sep. 28, 2011, Restriction Requirement.
U.S. Appl. No. 13/149,355, Jan. 30, 2013, Response to Non-Final Office Action.
U.S. Appl. No. 13/149,355, Oct. 15, 2013, Amendment and Request for Continued Examination (RCE).
U.S. Appl. No. 12/955,310, Sep. 4, 2013, Amendment and Request for Continued Examination (RCE).
U.S. Appl. No. 12/955,310, Jun. 7, 2013, Final Office Action.
U.S. Appl. No. 12/770,242, Apr. 27, 2012, Response to Non-Final Office Action.
U.S. Appl. No. 12/770,242, Jun. 8, 2012, Notice of Allowance.
U.S. Appl. No. 12/770,242, Aug. 27, 2012, Issue Fee payment.
U.S. Appl. No. 13/149,355, Aug. 3, 2012 Non-Final Office Action.
U.S. Appl. No. 12/955,310 (US201102755062), Nov. 29, 2010 (Nov. 10, 2011).
U.S. Appl. No. 13/149,355, May 31, 2011.
Bolotin et al., "Ultrahigh electron mobility in suspended graphene", *Solid State Communications*, 146: 351-355 (2008), available online Mar. 6, 2008.
Bunch et al., "Impermeable atomic membranes from graphene sheets", *NANO Letters*, 8 (8): pp. 2458-2462 (Jul. 17, 2008).
Bunch et al., "Electromechanical resonators from graphene sheets", *Science 26*, Jan. 2007, vol. 315, No. 5811, pp. 490-493.
Chen et al., "Performance of monolayer graphene nanomechanical resonators with eletrical readout", *Nature Nanotechnology*, pp. 1-7 (Sep. 20, 2009).
Dikin et al., "Preparation and characterization of graphene oxide paper", *Nature*, 448: 457-460 (Jul. 26, 2007).
Frank et al., "Mechanical properties of suspended graphene sheets", *J. Vac. Sci. Technol.*, B25(6): 2558-2561 (Nov./Dec. 2007).
Garcia-Sanchez et al., "Imaging mechanical vibrations in suspended graphene sheets", *NANO Letters*, 8(5): 1399-1403 (2008), published online Apr. 11, 2008.
Gorbachev et al., "Conductance of p-n-p graphene structures with "Air-bridge" top gates", *NANO Letters*, 8(7): 1995-1999 (2008), published online Jun. 11, 2008.
Guo et al., "Covalently bridging gaps in single-walled carbon nanotubes with conducting molecules", *Science*, 311: 356-359 (Jan. 20, 2006).
Guo et al., "Conductivity of a single DNA duplex bridging a carbon nanotube gap", *Nature Nanotech*, 3: 163-167 (Feb. 10, 2008).
Han et al., "Energy band-gap engineering of graphene nanoribbons", *Physical Review Letters 98*: 206805-1-206805-4 (May 18, 2007).
Kim et al., "Large-scale pattern growth of graphene films for stretchable transparent electrodes", *Nature*, 457: 706-710 (Feb. 5, 2009).
Knobel et al., "Nanometer-scale displacement sensing using a single electron transistor", *Letters to Nature*, 424: 291-293, (Jul. 17, 2003).
Lee et al., "Voltage controlled dielectric resonator oscillator using three-terminal MESFET varactor", *Electronic Letters*, 30(16): 1320-1321 (Aug. 4, 1994).
Li et al., "Large-area synthesis of high-quality and uniform graphene films on copper foils", *Science*, 324: 1312-1314 (Jun. 5, 2009).
Novoselov et al., "Two-dimensional atomic crystals", *PNAS*, 102(30): 10451-10453 (Jul. 26, 2005).
Rana, Farhan, "Graphene terahertz plasmon oscillators", *IEEE Transactions on Nanotechnology*, 7(1): 91-99 (Jan. 2008).
Sazonova et al., "A tunable carbon nanotube electromechanical oscillator", *Letter to Nature*, 431: 284-287 (Sep. 16, 2004).
Schultz et al., "Synthesis of linked carbon monolayers: Films, balloons, tubes and pleated sheets", *Proceedings of the National Academy of Sciences*, 105(21): 7353-7358 (published on-line on May 27, 2008).
Shivaraman et al., "Free-standing epitaxial graphene", *NANO Letters*, 9(9): 3100-3105 (2009), published online Aug. 10, 2009.
Stolyarova et al., "High-resolution scanning tunneling microscopy imaging of mesoscopic graphene sheets on an insulating surface", *Proceedings of the National Academy of Sciences*, 104(22): 9209-9212 (published on-line on May 29, 2007).

(56) References Cited

OTHER PUBLICATIONS

Stolyarova et al., "Observation of graphene bubbles and effective mass transport under graphene films", *NANO Letters*, 9(1): 332-337 (2009).

International Search Report for PCT/US2009/066217, dated Apr. 21, 2010.

International Search Report for PCT/US2009/06620, dated Feb. 3, 2010.

International Search Report for PCT/US2008/81147, dated Jan. 8, 2009.

U.S. Appl. No. 13/149,355, Apr. 25, 2013 Final Office Action.

U.S. Appl. No. 12/770,242 (US20110062422), filed Apr. 29, 2010 (Mar. 17, 2011).

U.S. Appl. No. 12/770,242, Nov. 28, 2011, Non-Final Office Action.

"Graphene based interconnect for BEOL", (authors:disclosed anonymously), *IP.com Prior Art Database Disclosure*, Disclosure No. IPCOM000206146D, published Apr. 14, 2011, pp. 1-6.

Ding et al., "Direct growth of few layer graphene on hexagonal boron nitride by chemical vapor deposition", *Carbon*, 49(7): 2522-2525 (2011), published online Feb. 15, 2011.

Forbeaux et al., "Heteroepitaxial graphite on 6H-SiC(0001): Interface formation through conduction-band electronic structure", *Journal Physical Review*, 58(24): 16396-16406 (Dec. 15, 1998).

International Search Report and Written Opinion for PCT/US2008/082070, dated Jan. 29, 2009.

Jousseaume et al., "Catalytic CVD growth of nanomaterials for advanced interconnects: Si nanowires and few Graphene layers/Carbon-Nanotubes composites", *ECS Transactions*, 35(2): 35-41 (May 2011).

Lippert et al., "Direct Graphene Growth on Insulator", submitted Jun. 10, 2011, retrieved online Dec. 12, 2011 from Cornell University Library, http://arxiv.org/abs/1106.2070v1. Article first published on Aug. 31, 2011 in *Phys. Status Solidi B*, 248(11): 2619-2622.

Prével et al., "Gold nanoparticle arrays on graphite surfaces", *Applied Surface Science*, 226: 173-177 (2004).

Rümmell et al., "Direct Low Temperature Nano-Graphene Synthesis over a Dielectric Insulator", submitted on Mar. 2, 2011, retrieved online Dec. 12, 2011 from Cornell University Library, http://arxiv.org/abs/1103.0497v1. pp. 1-13.

Insulator, submitted on Mar. 2, 2011, retieved online Dec. 12, 2011 from Cornell University Library, http://arxiv.org/abs/1103.0497v1. pp. 1-13.

U.S. Appl. No. 13/149,355, Sep. 12, 2014, Non-Final Office Action.

U.S. Appl. No. 12/955,310, Oct. 1, 2014, Final Office Action.

\* cited by examiner

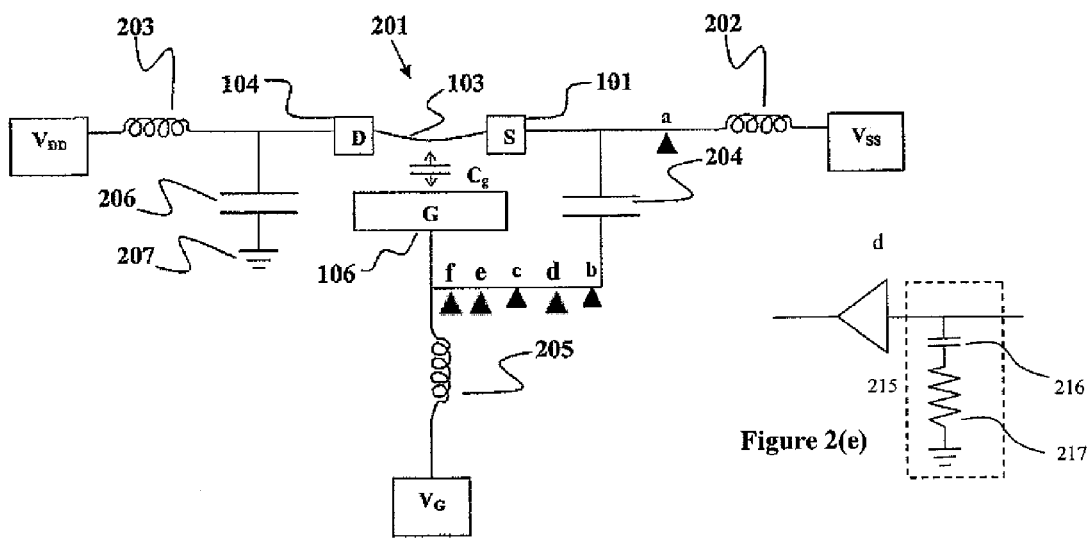
Figure 2(a)
Figure 2(e)
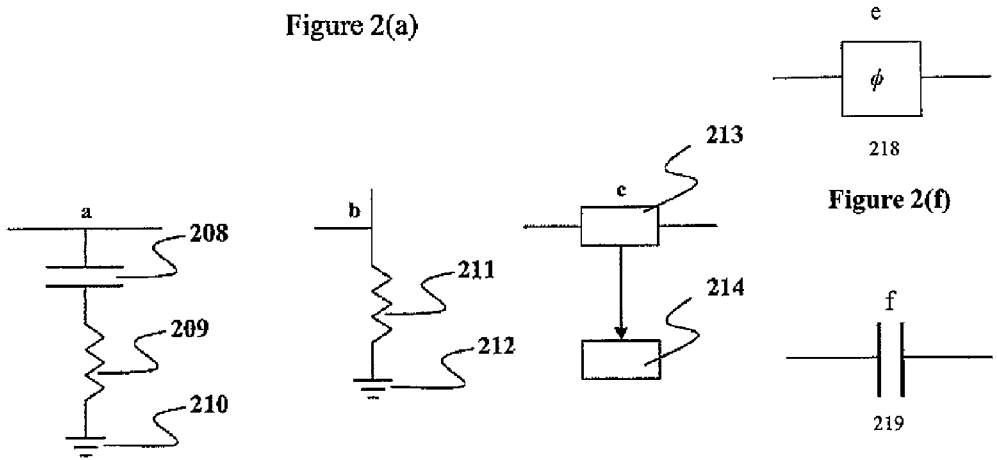
Figure 2(b)   Figure 2(c)   Figure 2(d)   Figure 2(g)
Figure 2(f)

400

| | |
|---|---|
| 410 | Form Substrate |
| 420 | Deposit Third Electrode |
| 425 | Pattern Third Electrode |
| 430 | Deposit Ectable Material |
| 440 | Form Layer of Graphene |
| 450 | Deposit Graphene Layer on Ectable Material |
| 460 | Pattern Graphene Layer |
| 470 | Deposit First Electrode |
| 475 | Pattern First Electrode |
| 480 | Deposit Second Electrode |
| 485 | Pattern Second Electrode |
| 490 | Expose Etchable Material to Etchant |

Figure 4

ELECTROMECHANICAL DEVICES AND METHODS FOR FABRICATION OF THE SAME

CROSS REFERENCE TO RELATED APPLICATIONS

This application is a continuation-in-part application of International Patent Application PCT/US2009/066217, entitled "Electromechanical Devices And Methods For Fabrication Of The Same," filed Dec. 1, 2009, which claims priority to U.S. Provisional Application No. 61/118,919, entitled "Three-Terminal Device Using Mechanically-Vibrating, High-transconductance Material," filed on Dec. 1, 2008, the disclosure of each of which is incorporated by reference in its entirety herein.

STATEMENT REGARDING FEDERALLY-SPONSORED RESEARCH

This invention was made with government support under CHE-0117752 awarded by the National Science Foundation and HR0011-06-1-0048 awarded by the Department of Defense. The government has certain rights in the invention.

BACKGROUND

1. Field

The present application relates to mechanically-vibrating, high-transconductance devices and methods for fabricating the same.

2. Background Art

Electromechanical devices have numerous applications across many fields of art and such devices can be utilized for creating oscillators, resonators, mass sensors, force sensors, position sensors, accelerometers and switches, just to name a few. Furthermore, it is desirable to create small devices, on the order of microns or nanometers. Such devices are often referred to as microelectromechanical devices (MEMS) or nanoelectromechanical devices (NEMS). However, in many applications it can be extremely difficult to fabricate such devices due to the very small scales involved.

Graphene, is formed in a hexagonal lattice of $sp^2$-hybridized carbon atoms. One property of graphene is that it allows for the etching of silicon dioxide from underneath a graphene layer placed on the surface of the silicon dioxide. Further, the etching process is accelerated underneath the graphene and it has also been found that graphene is not permeable to some etchants, such as hydrofluoric acid. Graphene has also been found to have other beneficial properties such as high stiffness, low mass density and high transconductance, making it an ideal material for use in MEMS or NEMS device application and also in fundamental studies of small scale mechanics.

Accordingly, there is a need in the art for fabricated electromechanical devices that make use of the high transconductance and other properties of graphene and for techniques for fabricating the same.

SUMMARY

A fabricated electromechanical device is disclosed herein. An exemplary device includes, a substrate, at least one layer of a high-transconductance material separated from the substrate by a dielectric medium, a first electrode in electrical contact with the at least one layer of a high-transconductance material and separated from the substrate by at least one first supporting member, a second electrode in electrical contact with the layer of a high-transconductance material and separated from the substrate by at least one second supporting member, where the first electrode is electrically separate from the second electrode, and a third electrode separated from the at least one layer of high-transconductance material by a dielectric medium and separated from each of the first electrode and the second electrode by a dielectric medium.

In some embodiments, the substrate can include the third electrode and in other embodiments, the third electrode can be a localized electrode deposited on the substrate. The third electrode can also be a localized electrode submerged into the substrate. Further, the high-transconductance material can be graphene and the dielectric medium can be either air or a vacuum. In the same or yet other embodiments, the substrate can be silicon. In some embodiments, the first, second or third electrodes can be metal electrodes and can further be gold electrodes. The at least one first supporting member or the at least one second supporting member can be silicon dioxide.

One exemplary fabricated electromechanical device can further include circuitry including a first voltage source electrically connected to the first electrode, a second voltage source electrically connected to the second electrode, a third voltage source electrically connected to the third electrode, where the first voltage source is electrically connected to the third voltage source, and a first capacitor electrically connected between the first voltage and the third voltage source. In the same or another embodiment, the fabricated electromechanical device can further include a first inductor electrically connected between the first voltage source and the first electrode, a second inductor electrically connected between the second voltage source and the second electrodes, and a third inductor electrically connected between the third voltage source and the third electrode.

The fabricated electromechanical can also include a second capacitor electrically connected between the second voltage source and the second electrode and further electrically connected to a ground. It can further include a third capacitor connected between the first voltage source and the first electrode, where the third capacitor is further electrically connected, in series, to a first resistor and a ground and, in some embodiments, it can include a second resistor electrically connected between the first capacitor and the third electrode and further electrically connected to a ground. In same or other embodiments, the fabricated electromechanical device can include a directional coupler electrically connected between the first capacitor and the third electrode and further electrically connected to an electrical reading device.

In one exemplary embodiment, the fabricated electromechanical device can further include circuitry which includes, a first voltage source electrically connected to a power splitter, a first capacitor electrically connected between the power splitter and the second electrode, a second voltage source electrically connected between the first capacitor and the second electrode, a first current amplifier electrically connected to the first electrode, a second current amplifier electrically connected to the first current amplifier, a frequency mixer electrically connected to the second current amplifier and the high frequency voltage source, a second capacitor electrically connected between the high frequency mixer and the third electrode, and a third voltage source electrically connected between the second capacitor and the third electrode.

In some embodiments, the fabricated electromechanical device further includes, a third capacitor electrically connected between the second voltage source and the second electrode, a fourth capacitor electrically connected between the first electrode and the current amplifier, and a fifth capacitor electrically connected between the third voltage source and the third electrode. The device can also include a first inductor electrically connected between the second voltage source and the second electrode, and a second inductor electrically connected between the third voltage source and the third electrode. Further, in the same or other embodiments, the second current amplifier is operable to provide an output.

A method for fabricating an electromechanical device is also disclosed herein. An exemplary method includes, depositing a first layer of etchable material on a substrate, depositing at least one layer of graphene on the etchable material, depositing a first electrode on the etchable material such that at least a first portion of the at least one layer of graphene is covered by the first electrode and at least a portion of the first electrode is directly in contact with the etchable material, depositing a second electrode on the etchable material such that at least a second portion of the at least one layer of graphene is covered by the second electrode and at least a portion of the second electrode is directly in contact with the etchable material, and exposing the etchable material to an etchant to remove the etchable material around the first and second layers of metal and underneath the at least one layer of graphene, thus fabricating a device having the at least one layer of graphene suspended above the substrate.

In some embodiments, the method further includes depositing a third electrode on the substrate, which can involve depositing the third electrode on the first layer of etchable material. The method can also include depositing a second layer of etchable material on the substrate and in some embodiments, it can further include, depositing a third electrode on the first layer of etchable material, where depositing the second layer of etchable material on the substrate includes depositing the second layer of etchable material on the first layer of etchable material, where depositing the at least one layer of graphene on the etchable material includes depositing the at least one layer of graphene on the second layer of etchable material, where depositing the first electrode on the etchable material includes depositing the first electrode on the second layer of etchable material, and where depositing the second electrode on the etchable material includes depositing the second, electrode on the second layer of etchable material.

In same or other embodiments, the method further includes depositing a third electrode on the second layer of etchable material, where depositing the at least one layer of graphene on the etchable material includes depositing the at least one layer of graphene on the first layer of etchable material, where depositing the first electrode on the etchable material includes depositing the first electrode on the first layer of etchable material, where depositing the second electrode on the etchable material includes depositing the second electrode on the first layer of etchable material, and where depositing the second layer of etchable material on the substrate includes depositing the second layer of etchable material on the first layer of etchable material.

In some embodiments, the method can also include patterning the at least one layer of graphene, which can be performed utilizing lithography to pattern the deposited layer and/or can be performed utilizing oxygen plasma etching to pattern the at least one layer of graphene. In the same or other embodiments, exposing the etchable material to an etchant includes acid vapor phase etching of the etchable material and/or exposing the etchable material to a buffered oxide etchant.

BRIEF DESCRIPTION OF THE DRAWINGS

The accompanying drawings, which are incorporated and constitute part of this disclosure, illustrate some embodiments of the disclosed subject matter.

FIG. 2(a) illustrates a diagram of circuitry connected to a fabricated electromechanical device in accordance with an exemplary embodiment of the disclosed subject matter.

FIGS. 2(b)-(g) illustrate additional circuitry connected to a fabricated electromechanical device in accordance with exemplary embodiments of the disclosed subject matter.

FIG. 4 illustrates a process for fabricating an electromechanical device in accordance with an exemplary embodiment of the disclosed subject matter.

Throughout the figures and specification the same reference numerals are used to indicate similar features and/or structures.

DETAILED DESCRIPTION

The techniques described herein are useful for fabricating micro- and nanoelectromechanical devices. Although the description is focused on oscillators, the techniques herein can also be useful for producing other devices, such as resonators, mass sensors, force sensors, position sensors, accelerometers and switches.

The subjected matter disclosed herein provides for fabricated micro- and nanoelectromechanical devices, the techniques for fabricating such devices and the associated circuitry for particular applications. The techniques described herein make use of the properties of certain high-transconductance materials, particularly for the example of monolayer graphene, to produce fabricated devices having a layer of graphene suspended from two electrodes. High transconductance materials have transconductance values of approximately 100 nS (nano-siemens) or greater, with graphene and carbon nanotubes able to achieve as much as 7-8 µS. Devices fabricated according to the disclosed subject matter were found to have a transconductance in the range 100 nS to 1 µS. By further including a gate electrode and the appropriate circuitry, as discussed in detail below, the suspended graphene sheet can be induced to vibrate. Such vibration can be detected using the circuitry, as can any alterations in such vibration due to, for example, a change in the mass of the graphene layer caused the deposition of some particles, e.g., the vibrating graphene sheet can act as a mass sensor. Another exemplary use of such fabricated devices could be as clocks, since the graphene sheet will have a definite resonance frequency based on its particular characteristics such as width, length and the applied voltage to the gate electrode.

Figure 1A:
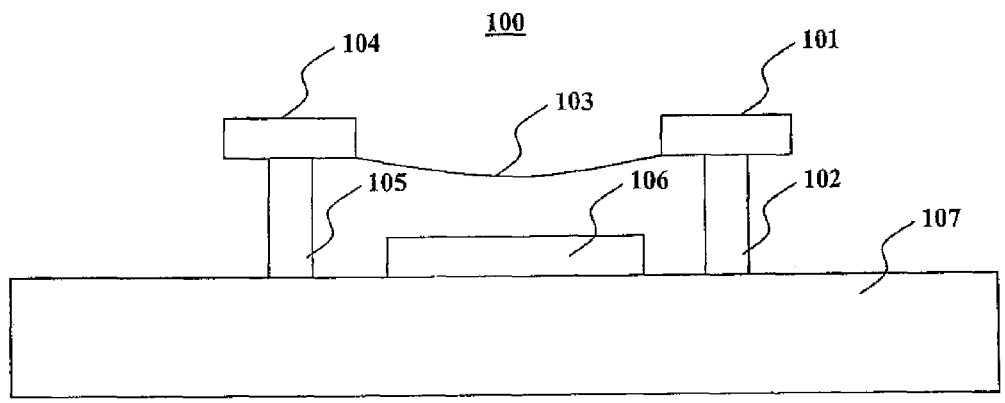
FIGS. 1(a)-(e) illustrate side views of various configurations of a fabricated electromechanical device in accordance with exemplary embodiments of the disclosed subject matter.

FIG. 1(a) illustrates a fabricated electromechanical device 100 including a first electrode 101 and a second electrode 104, each of which can be metal electrodes. First and second electrodes 101, 104 can also comprise a layer of metal, e.g., gold, deposited on another layer of a different metal, e.g., chromium, for the purpose of providing an adhesive surface for the gold layer. The first and second electrodes 101, 104 can be formed from any metal appropriate for use in the semiconductor arts, such as gold, aluminum, copper, titanium, etc. In some exemplary embodiments, the first and second electrodes 101, 104 can have a thickness of, for example, 5-1000 nm, though for some applications even thicker electrodes can be used. The electrode thickness can, in some embodiments, dependent on the thickness of the resist and the type mask used for depositing the electrodes 101, 104, the etching layer that will form the supporting members 102, 105, the desired size of various features on the surface of the substrate 107 (e.g., supporting members 102, 105), the amount of the substrate 107 surface to be covered and conductivity of the substance used to form electrodes 101, 104. In some embodiments, a electron beam resist that allows for printing lines as narrow as 10 nm between electrodes 101, 104 can be used and such resists can have no practical limit on the length of the electrodes 101, 104 running in the direction along the electrode edge. Further in some exemplary embodiments, the electrodes 101, 104 thickness will not exceed that of the resist or that of the feature underneath electrodes 101, 104 (e.g., supporting members 102, 105) to reduce the risk of not being able to remove the sacrificial layer (e.g., the etchable layer used to form supporting members 102, 105) due to bridging of the electrodes 101, 104 across the resist gap. Additionally, if metal film coverage is uniform down to a few nanometers thickness, a factor to considered in selecting a thickness becomes the conductivity of the metal chosen for the electrode. Gold can be fairly conductive relative to the graphene down to thicknesses as little as 5 nm, but copper and aluminum are known to oxidize substantially within a few nanometers from the surface, which could render the electrodes insulating at these thicknesses.

The planar dimensions of the first and second electrodes 101, 104 can be selected based on the particular application of fabricated device 100, and can be, for example, on the order of 10 nm-10 µm, or in some embodiments, can be 10-500 nm. In one exemplary embodiment, the electrodes 101, 104 act as a mask during the wet etching process (described in detail below) and due to the isotropic nature of the sacrificial layer, e.g., silicon dioxide, the etching will undercut the sacrificial layer that becomes supporting members 102, 105 for a distance (in the x, y plane) that is close to or the same as the depth of the etching. Thus, the lower limit for the planar (e.g., x, y) dimensions for electrodes 101, 104 should be at least as large as the etching depth, which in some embodiments can be on the order of hundreds of nanometers, e.g., 100-500 nm or in one embodiment 200 nm. The upper limit for the planar (e.g., x, y) dimensions for electrodes 101, 104 can be set as any value desired by the lithography process, and in some embodiments can be on the order of several microns, e.g., 1-10 µm.

Fabricated electromechanical device 100 further includes a substrate 107, which in some exemplary embodiments includes silicon, though other materials such as quartz, glass, or indium tin oxide (ITO) can be used. In one exemplary embodiment, the substrate must be resistive enough at high frequencies to block signal loss due to cross-coupling of signals from the electrodes to the substrate underneath. Good low-frequency conductivity can be desirable for additional fine-tuning of the devices' properties, which can be a reason why resistive silicon substrates are ideal in some embodiments. Substrate 107 can be formed to any dimensions appropriate for a particular applicant and in some exemplary embodiments can have a thickness in the range of 500 microns to 1 mm, though thicker substrates 107 can also be used. Commercially available wafers 107 with diameters of 100 mm can have thicknesses between 500 and 700 microns. Larger wafers, e.g., 300 mm diameter wafers, can have thicknesses in the 700-800 micron range. Further, in some embodiments, substrate 107 can include layers of more than one type of material, e.g., a silicon base layer and a silicon dioxide surface layer.

Each of the first and second electrodes 101, 104 are supported on the substrate 107 by supporting members 102, 105, respectively, which in some exemplary embodiments can be composed of silicon dioxide. Each of supporting members 102, 105 can be composed of one or more parts depending on the configuration prior to fabrication: for example, FIG. 1(f) is a top view of an exemplary device where each supporting member 102, 105 is composed of two separate parts. In some embodiments, supporting members 102, 105 can be 10 nm-10 µm thick, and in one embodiment, supporting members 102, 105 can be 50-500 nm thick. In one embodiment there is no practical limit to how thick the sacrificial layer that is the basis for the supporting member 102, 105 can be, except by the exponential oxidation process that is employed to oxidize the wafer 107, and can be used to oxidize the whole wafer in some embodiments. In the same or another embodiment, the thinnest sacrificial oxide layer used to form supporting members 102, 105 can be 20 nm thick. A 300 nm oxide layer can be advantageous for spotting the exfoliated graphene optically due to absorption contrast.

A high-transconductance material 103 is suspended between electrodes 101, 104, and in an exemplary embodiment includes one or more layers of graphene. The high-transconductance material 103 should be in electrical contact with each of the first and second electrodes 101, 104. In one exemplary embodiment, such electrical contact can be by direct contact with a conducting layer of electrodes 101, 104, or a conducting layer in contact with electrodes 101, 104. In an alternative embodiment, such electrical contact can be by indirect contact with electrodes 101, 104, by, for example, being in contact with a semiconducting layer between electrodes 101, 104 and the high-transconductance material 103. In the same or other embodiments, the electrical contact between high-transconductance material 103 and electrodes 101, 104 can be non-linear. Further, the electrical contact should be of sufficiently low resistance such that some non-negligible current can cross the high-transconductance material 103.

The high-transconductance material 103 is separated from the substrate 107 by a dielectric medium, such as air or a vacuum. In one embodiment, the high-transconductance material 103 includes a single sheet, or ribbon, of monolayer graphene, e.g., a sheet of graphene having a single atomic thickness, suspended between electrodes 101, 104. The presently disclosed subject matter also envisions the use of suspended multiple layered sheets of graphene 103, e.g., 2-30 layers or in some embodiment up to 10 nm thick. Thickness beyond 30 layers, or 10 rim graphene thickness, can result in electrostatic screening from the layers closer to the substrate 107 which can lower the transconductance to a point where the resonances cease to give out significant signal and can be difficult to detected further. Chemical vapor deposition techniques used to deposit the graphene 103, in one exemplary embodiment, can consistently provide large coverage for up to 3 layers of graphene (which is approximately 1 nm in thickness) and at the same time still provide for a fairly high transconductance. The planar dimensions (e.g., the (x, y) dimensions along the substrate plane) of the high-transconductance material (e.g., graphene) 103 can be selected for the particular application of fabricated device 100 and in one exemplary embodiment, graphene 103 can be patterned into a sheet.

Fabricated electromechanical device 100 further includes a third electrode 106, which in the exemplary embodiment illustrated in FIG. 1(a) can be deposited on the surface of substrate 107. The third electrode 106 can be composed of metal, e.g., gold, in some embodiments and can also include a layer of another metal, e.g., chromium, to assist in adhering the gold layer to the substrate 107. Similar to the first and second electrodes 101, 104, the third electrode 106 can be formed from any metal appropriate for use in the semiconductor arts, such as gold, aluminum, copper, titanium, etc. In some exemplary embodiments, the third electrode 106 can have a thickness of, for example, 5-1000 nm, though for some applications even thicker electrodes can be used. In an exemplary embodiment where the third electrode is a bottom local gate electrode (e.g., 106 in FIG. 1(a)), there can be a second sacrificial layer deposition on top of the third electrode, thus too thick a electrode could produce uneven surface (e.g., a "bump") in the surface of the second sacrificial layer. On the other hand, too thin a electrode could limit the electrical conductivity, thus, 10 nm to 30 nm can be ideal for such an exemplary embodiment, and a 20 nm thick layer of chromium and gold has been experimentally demonstrated. For top local gate electrode 106 configuration (e.g., FIG. 1(c)), the upper limit can be similar to the first and second electrodes 101, 104, and the lower limit can be determined based on the mechanical stability and electrical conductivity, and in one exemplary embodiment a 20 nm thick layer of chromium and gold was also experimentally verified, though layers as thin as 5 nm can be possible.

The planar dimensions (e.g., the (x, y) dimensions along the substrate plane) of the third electrode can be selected based on the particular application of fabricated device 100, and can be, for example, on the order of 10 nm-10 μm, or in some embodiments, can be 10-500 nm. The same considerations regarding the planar dimensions of the first and second electrodes 101, 104, as discussed above, can be applicable to the third electrode 106. In the exemplary embodiment illustrated in FIG. 1(a) the third electrode 106 can be referred to as a local gate electrode, the first electrode 101 can be the source electrode and the second electrode 104 can be the drain electrode. Further, in the embodiment of FIG. 1(a) the dimensions of the third electrode 106 can be selected based on the dimensions of the first and second electrodes 101, 104 and the dimensions of the graphene layer 103, such that the third electrode 106 is located between supporting members 102, 105. In addition, the third electrode 106 is also separated from the high-transconductance material 103 by a dielectric medium, such as air or a vacuum.

Figure 1B:
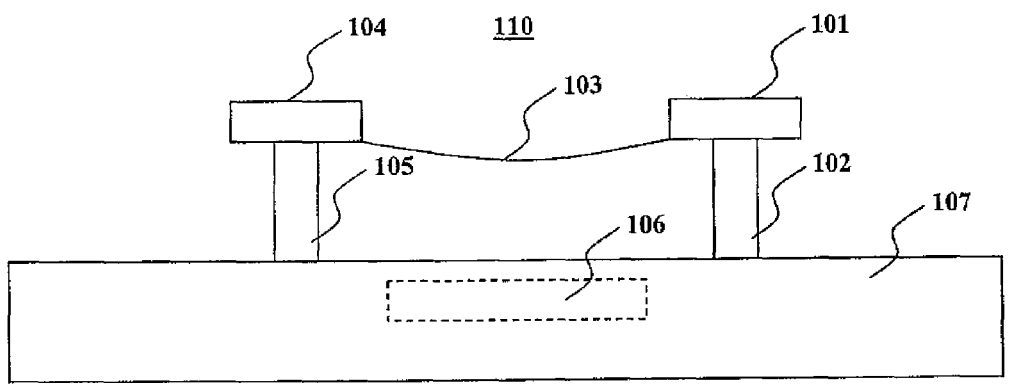
Figure 1C:
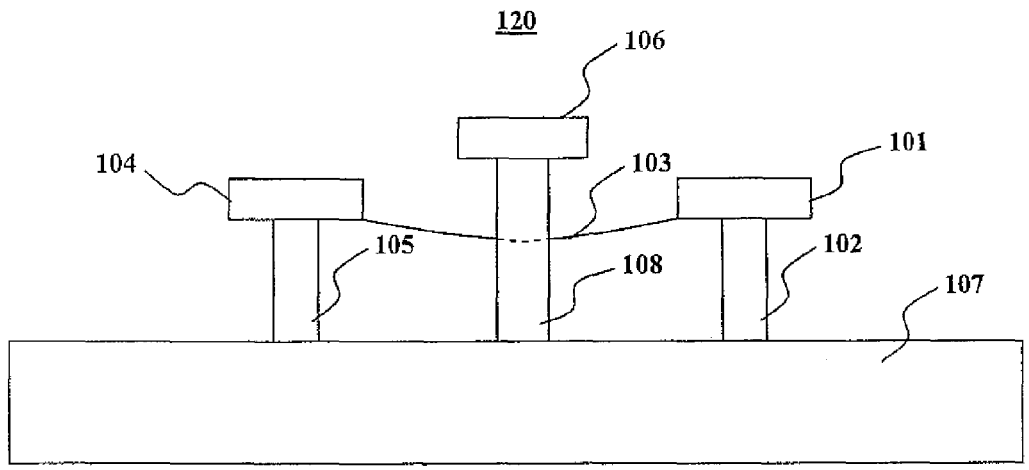
Figure 1D:
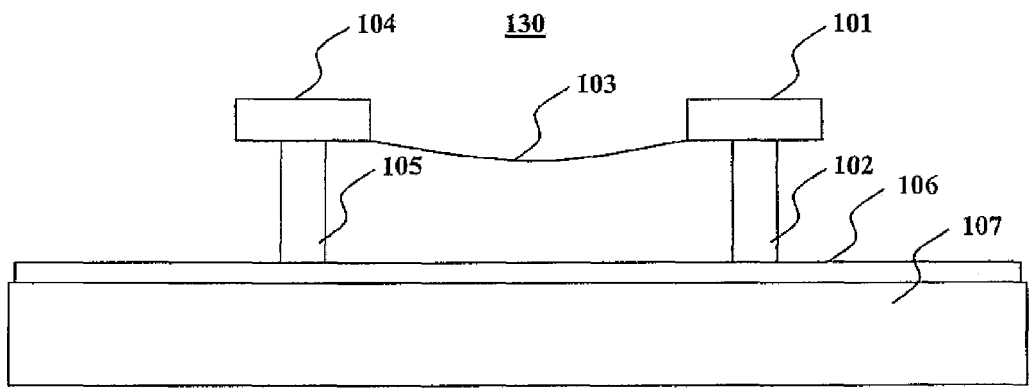

FIG. 1(b) illustrates an exemplary fabricated electromechanical device 110 similar to that shown in FIG. 1(a), except that the third electrode 106 is submerged in the substrate 107. FIG. 1(c) illustrates an exemplary fabricated electromechanical device 120 that is also similar to that shown in FIG. 1(a), except that the third electrode 106 is suspended above the high-transconductance layer 103 and is further supported by supporting member 108, which has sufficient height to separate the high-transconductance layer 103 from the third electrode 106, and in some embodiments can have a thickness range similar to that of supporting members 102, 105, except that it must be high enough to separate the third electrode from the graphene 103. FIG. 1(d) illustrates an exemplary fabricated device 130 where the third electrode 106 is a global gate electrode comprising a layer of metal, e.g., gold or gold layered upon chromium or other appropriate metals, which has be deposited across the entire surface of the substrate 107.

Figure 1E:
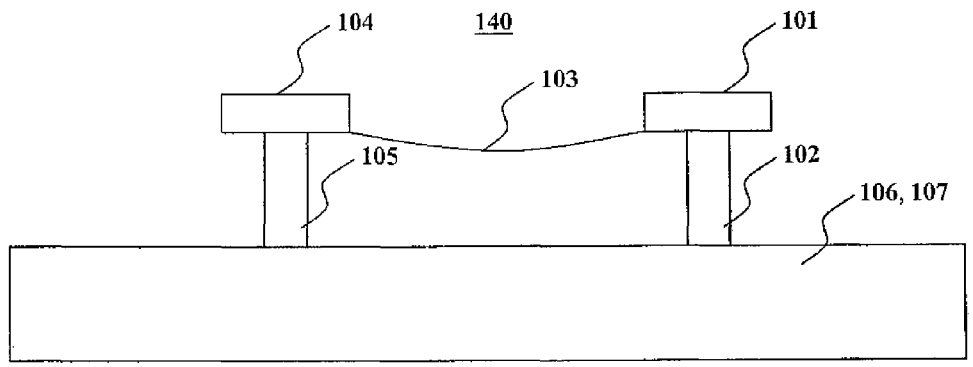
Figure 1F:
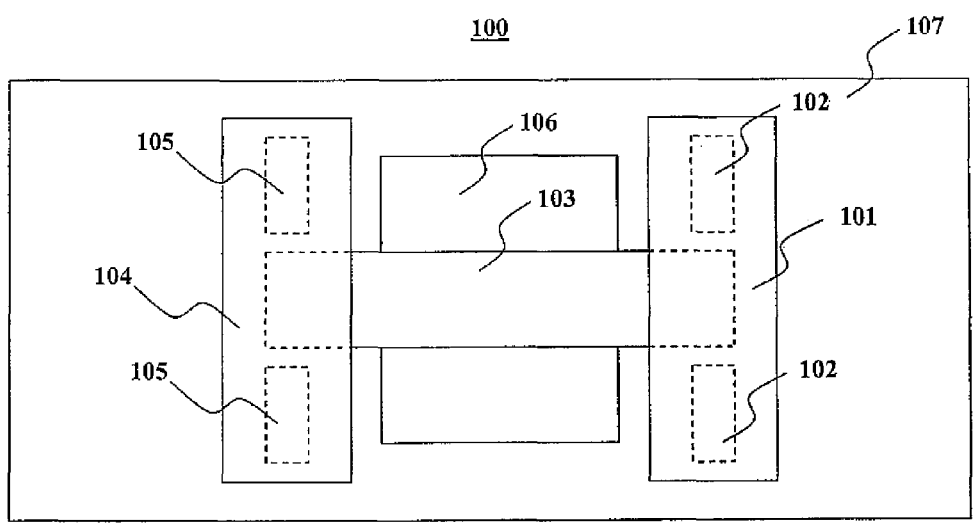
FIG. 1(f) illustrates a top view of a fabricated electromechanical device in accordance with an exemplary embodiment of the disclosed subject matter.

FIG. 1(e) illustrates an exemplary fabricated electromechanical device 140, where the third electrode 106 and the substrate 107 are the same, e.g., the substrate 107 acts as the third electrode 106. In an exemplary embodiment illustrated in FIG. 1(e), the substrate 107 can be silicon or other known semiconductive substrates such as quartz, glass, or indium tin oxide (ITO) can be used, which can appropriately function as a gate electrode 106. FIG. 1(f) is a top view of an exemplary fabricated device 100, illustrating that the fabrication process, discussed in detail below, has resulted in the high-transconductance (e.g., graphene) layer 103 being suspended from each of the electrodes 101, 104, which are supported by the support structures 102, 105.

FIG. 2(a) illustrates circuitry 200 connected to a fabricated device 201, for example any one of the fabricated devices 100, 110, 120, 130 or 140 illustrated in FIGS. 1(a)-(f). As illustrated in FIG. 2(a) circuitry 200 includes a first voltage source $V_{SS}$, which in one exemplary embodiment is the source voltage for circuitry 200, electrically connected to the first electrode 101, which in one exemplary embodiment is the source electrode S. The first voltage source $V_{SS}$ can be, in some embodiments, a direct current (DC) voltage source, which in other embodiments $V_{SS}$ can be configured to provide DC or alternating current (AC), depending on the needs of a particular application. In one embodiment, $V_{SS}$ is a DC source. Circuitry 200 further includes a second voltage source $V_{DD}$, which in one exemplary embodiment is the drain voltage for circuitry 200, electrically connected to the second electrode 104, which in one exemplary embodiment is the drain electrode D. Similar to $V_{SS}$, second voltage source $V_{DD}$ can provide either a DC or AC source. In one embodiment the second (drain) electrode 104 and first (source) electrode 101 illustrated in FIG. 2(a) can be exchanged for one another.

Circuitry 200 further includes a third voltage source $V_G$, which in one exemplary embodiment is the gate voltage for circuitry 200, electrically connected to the third electrode 106, which in one exemplary embodiment is the gate electrode G. As with the first and second voltage sources $V_{SS}$, $V_{DD}$, the third voltage source $V_G$ can provide either a DC or AC source. As further illustrated in FIG. 2(a), the first voltage source $V_{SS}$ is electrically connected to the third electrode 106 and there is a first capacitor 204 electrically connected between the first voltage source $V_{SS}$ and the third electrode 106. The first capacitor 204 can have any appropriate capacitance depending on the particular application of the fabricated device. In one exemplary embodiment the absolute value of the impedance of the capacitor, defined as $$Z = \frac{1}{(2\pi FreqC)},$$

should be negligible compared to that of other components in series such as the graphene 103 in the frequency range of interest. For example, if the resonances are located at Freq=100 MHz, and assuming the graphene 103 has a real impedance of 1 kΩ for simplicity, then a ratio of perhaps 100 to 1 is appropriate. A requirement of Z=10Ω impedance would set the capacitance C~160 pF as the minimum capacitance allowed at the input.

In one exemplary embodiment, circuitry 200 can further include a first inductor 202 electrically connected between the first voltage source $V_{SS}$ and the first electrode 101. The first inductor 202 can have any appropriate inductance depending on the particular application of the fabricated device. In one exemplary embodiment, the impedance absolute value of the inductor, defined as $Z=(2\pi FreqL)$, should be large compared to that of other components in series such as the graphene in the frequency range of interest. For example, if the resonances are located at Freq=100 MHz, and assuming the graphene has a real impedance of 1 kΩ for simplicity, then a ratio of 100 to 1 can be appropriate in one exemplary embodiment. A requirement of Z=100 kΩ impedance would set L~160 µH as the minimum inductance allowed at the input. Circuitry 200 can also include a second inductor 203 electrically connected between the second voltage source $V_{DD}$ and the second electrode 104 and a third inductor 205 electrically connected between the third voltage source $V_G$ and the third electrode 106. The second inductor 203 and third inductor 205 can have any appropriate inductance depending on the particular application of the fabricated device, and in one exemplary embodiment, can be determined in the same fashion as the first inductor 202. As illustrated in FIG. 2(a), circuitry 200 can also include a second capacitor 206 electrically connected between the second voltage source $V_{DD}$ and the second electrode 104 and further electrically connected to a ground 207. The second capacitor 206 can have any appropriate capacitance depending on the particular application of the fabricated device, and in one exemplary embodiment the capacitance of the second capacitor 206 can be determined in the same fashion as the first capacitor 204.

FIG. 2(b) illustrates additional components that can be included in circuitry 200 at, for example, point a in FIG. 2(a). Such components can be included for the purpose of load matching, as is understood in the art, and can include a third capacitor 208 electrically connected between the first voltage source $V_{SS}$ and the first electrode 101, where the third capacitor 208 is further electrically connected, in series, to a first resistor 209 and a ground 210. The third capacitor 208 can have any appropriate capacitance depending on the particular application of the fabricated device, and in one exemplary embodiment the capacitance of the third capacitor 208 can be determined in the same fashion as the first capacitor 204. The first resistor 209 can have any appropriate resistance depending on the particular application of the fabricated device, for example, 1-100 kΩ in one exemplary embodiment. The first resistor 209 can be used for converting the current into a voltage and should have a resistance much larger than that of graphene 103. In one exemplary embodiment having a 100 to 1 requirement, with the graphene 103 having a resistance of 1 kΩ, the first resistor 209 would have resistance of 100 kΩ at a minimum. A highly resistive gate, on the other hand, already acts as a current-to-voltage converter, rendering this option as a way to fine tune the device.

FIG. 2(c) illustrates additional components that can be included in circuitry 200 at, for example, point b in FIG. 2(a). Such components can also be included for the purpose of load matching, as is understood in the art, and can include a second resistor 211 electrically connected between the first capacitor 204 and the third electrode 106 and further electrically connected to a ground 212. The second resistor 211 can have any appropriate resistance depending on the particular application of the fabricated device, and in one exemplary embodiment, the resistance of the second resistor 211 can be determined in the same manner as the first resistor 209, discussed above. In alternative embodiments, the load matching component can take a similar configuration as is depicted in FIG. 2(b), i.e., include both a capacitive element and a resistive element in serial connection.

FIG. 2(d) illustrates additional components that can be included in circuitry 200 at, for example, point c in FIG. 2(a). Such components can be included for the purpose of determining the frequency of vibration of the suspended high-transconductance layer 103 and include a directional coupler 213 electrically connected between the first capacitor 204 and the third electrode 106 and further electrically connected to an electrical reading device 214, which, in some embodiments, can be a spectrum analyzer which can be capable of determining power versus frequency for the purpose of detecting the resonance. In some embodiments, the directional coupler 213 can be an external device that can be used to extract some of the high-frequency power to a detector (not shown). The directional coupler 213, in one exemplary embodiment, should be matched to the impedance of the transmission line attached to it, e.g., 50Ω, work in the frequency range of interest, and can extract less than 10% of the power to the detector.

FIG. 2(e) illustrates additional components that can be included in circuitry 200 at, for example, point d in FIG. 2(a). Such components can be included for the purpose of electrical signal amplitude amplification. One example of such components is a high frequency amplifier 215 with a gain of greater than 1, and operates in a range of ten to few hundred mega hertz. For example, a Agilent/HP 8447D amplifier (0.1 to 1300 MHz) can be used. Additionally, the amplifier 215 can be used in conjunction with an optional impedance or load matching component (as depicted in FIG. 2(e) within the box bounded by a dashed line), which can include a capacitor 216 and a resistor 217.

FIG. 2(f) illustrates additional components that can be included in circuitry 200 at, for example, point e in FIG. 2(a). Such components can be included for the purpose of electrical signal phase modulation. One example of such components is a high frequency phase shifter 218, with the ability to adjust the phase of incoming high frequency electrical signal up to 90 degrees.

It should be understood that the order of the points b, c, d, and e at which the various optional components can be attached is generally arbitrary (except when restricted by practical considerations if multiple optional components are used), and not limited to what is depicted in FIG. 2(a).

FIG. 2(g) illustrates additional components that can be included in circuitry 200 at, for example, point f in FIG. 2(a). One example of such components is an in-series capacitor 219 for purpose of blocking out DC signal when other components such as an amplifier, phase shifter, and/or directional coupler are included in the circuit. In this case, the capacitor 219 can be placed closer to the T junction than the points where the other aforementioned optional components are connected.

Figure 2H:
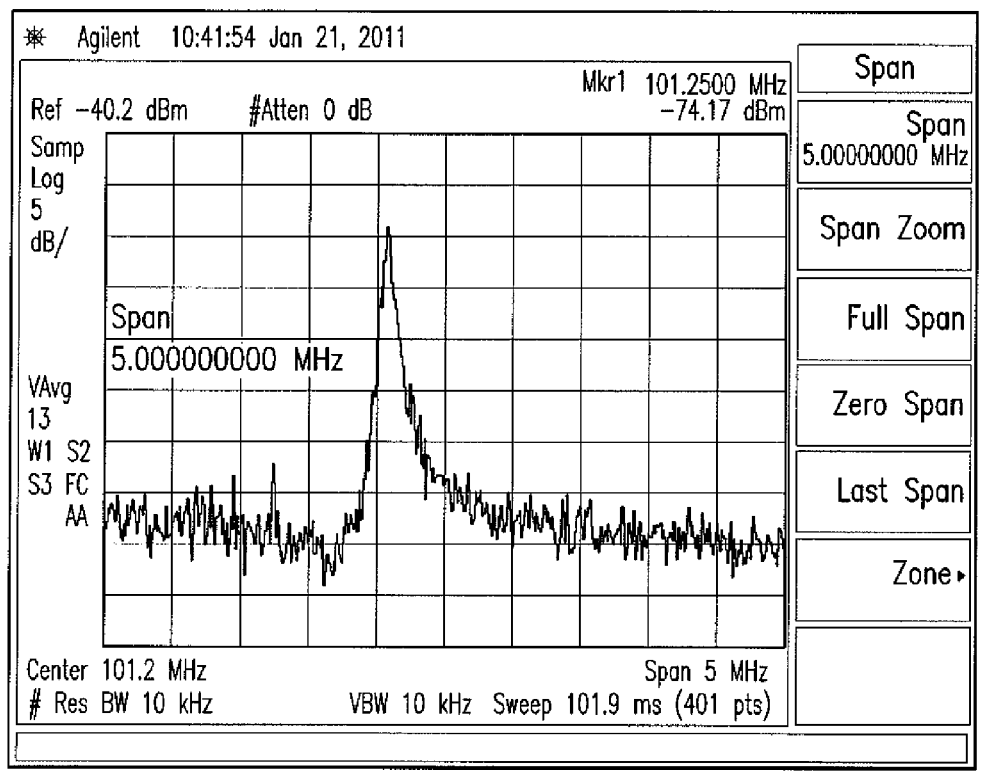
FIG. 2(h) depicts a screen shot from a spectrum analyzer for an embodiment of a circuit.

FIG. 2(h) depicts a screen shot from a spectrum analyzer (described above in connection with FIG. 2(d)) for an embodiment of the circuit that also includes an amplifier 215 at point d and an in-series capacitor 219 at point f. The plot of the screen shot shows the electrical signal amplitude versus frequency, where the x-axis is frequency, in unit of MHz, and the y-axis is in unit of dBm, which represents electrical power. The peak around 100 MHz indicates the resonant frequency of a self-sustained oscillation of the circuit as an oscillator. The resonant frequency can be tuned by adjusting the DC voltages, e.g., by varying the voltage difference between $V_{DD}$ and $V_G$ or the difference between $V_{SS}$ and $V_G$. Meanwhile, the amplitude of the intrinsic signal of the graphene (as opposed to the external amplification coming from an amplifier, e.g., amplifier 215 described above) can be tuned by varying the difference between $V_{DD}$ and $V_{SS}$.

Figure 3:
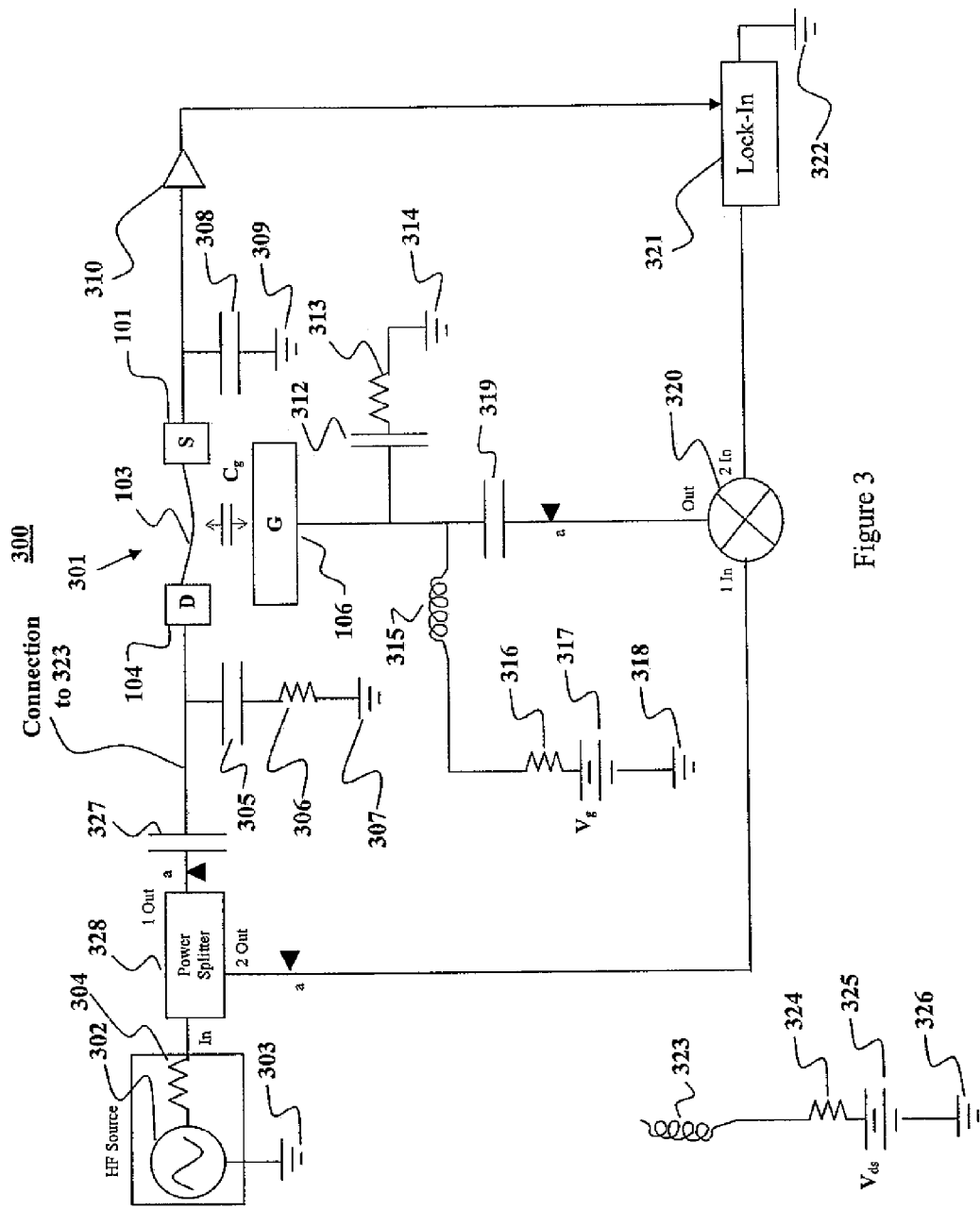
FIG. 3 illustrates a diagram of circuitry connected to a fabricated electromechanical device in accordance with an exemplary embodiment of the disclosed subject matter.

FIG. 3 illustrates another exemplary circuitry configuration 300 for fabricated device 301, for example any one of the fabricated devices 100, 110, 120, 130 or 140 illustrated in FIGS. 1(a)-(f). Circuitry 300 includes a first (e.g., high frequency (HF)) voltage source 302, which can be electrically connected to ground 303 and can further be connected to the second (drain) electrode 104. In an alternative embodiment the second (drain) electrode 104 and first (source) electrode 101 illustrated in FIG. 3 can be exchanged for one another. In some embodiments, HF voltage source 302 can provide an AC source or a DC source depending on the particular application, and in an embodiment HF voltage source 302 provides an AC source as illustrated in FIG. 3 at a frequency range which can be in the range of the resonance frequency of the device 100. For example, devices having graphene 103 lengths ranging from 500 nm to 3 μm have resonance frequencies in the range of 10-100 MHz. Upon DC tuning of the gate voltage $V_g$, the resonance can be shifted to the 200 MHz vicinity, though more aggressive DC tuning is possible. Longer devices (e.g., with longer graphene 103 lengths) have lower resonance frequencies, while shorter devices can have resonances close to 1 GHz or larger.

As further illustrated in FIG. 3, a first resistor 304 can be electrically connected between the HF voltage source 302 and the second electrode 104. The first resistor 304 can have any appropriate resistance depending on the particular application of the fabricated device, for example, 1-100 n in one exemplary embodiment. In one embodiment, resistor 304 can be incorporated into HF source 302 and further can have a resistance of 50Ω, which in some embodiments is ideal for delivering a precise HF amplitude to a 50Ω termination through a transmission line with 50Ω characteristic impedance. Most commercial HF sources are matched to 50Ω as a standard.

Circuitry 300 further includes a power splitter 328 that, in one embodiment, works in the frequency range of HF source 302, and is connected to the HF source as illustrated in FIG. 3. Power splitter 328 can be a −3 dB splitter that divides the power by 50% to each of the output lines. Electrically connected between the power splitter 328 and the second electrode 104 is a first capacitor 327, which can further be connected to a first inductor 323, which can be connected, in series, to a second resistor 324 and a second voltage source 325 ($V_{ds}$) and a ground 326. Second voltage source 325 ($V_{ds}$) can be a DC voltage source in one exemplary embodiment, and second resistor 324 can have a resistance that corresponds to the resistance of the DC voltage source 325 ($V_{ds}$), which in some embodiments can be negligible compared to any resistance that comes after the series, such that the voltage at the output is constant. The first capacitor 327 and the first inductor 323 together form a bias tee, as is known in the art. Further, first capacitor 327 blocks DC from reaching and damaging the HF source 302 and, in some embodiments, first capacitor 327 can have negligible impedance at the frequency of resonance, while having a large impedance at the frequency of detection. In one exemplary embodiment the first capacitor 327 can have similar properties as the third capacitor 305, which are discussed in more detail below. The inductance of first inductor 323 can be such that its impedance is negligible at the frequency of detection (e.g., 1 kHz) and below, providing a low-frequency path to a DC source 325 ($V_{sd}$, usually set to ground during AC experiments; this path (e.g., 323 to 326) can exist in order to create a detectable low-frequency current across the device 301), but should have very large high-frequency impedance compared to the graphene 103 at the resonant frequency, otherwise power loss to the graphene 103 can result. Also, following the power splitter 328 on each line a voltage attenuator can be inserted to control the signal amplitude going to D (104) and G (106) independently. In addition, another voltage attenuator can be inserted between the high-frequency mixer 320 and the second capacitor 319.

Further, circuitry 300 can include a third capacitor 305 electrically connected between the HF voltage source 302 and the second electrode 104, and the second capacitor 305 can further be electrically connected, in series, to a third resistor 306 and a ground 307. The third capacitor 305 can have any appropriate capacitance depending on the particular application of the fabricated device. For example and similar to the first capacitor 327, third capacitor 305 can have an impedance that is negligible compared to that of other components in series, especially the 50Ω termination to ground, in the frequency range of interest, but can also be much larger than that of other components in parallel, in particular the first inductor 323, at the frequency of detection in the lock-in amplifier 321. In some embodiments, the typical detection frequencies are 1 kHz, at which frequency a capacitance of 100 nF would have an impedance of 1.6 kOhms, much larger than the typical impedance of the inductor 323 used (a 1 mH inductor would represent a 6Ω, impedance at 1 kHz, for example); at 100 MHz, that capacitor's impedance reduces to 0.016Ω, negligible compared to the 50 Ohms termination (and to the inductor's impedance as well, which would be 600 kΩ at 100 MHz for the 1 mH value). The third resistor 306 can have any appropriate resistance depending on the particular application of the fabricated device, for example, 1-100Ω in one exemplary embodiment. In one embodiment, the resistance of the third resistor 306 matches that of the first resistor 304, e.g., 50Ω; in such an embodiment, it is necessary that the resistance match in order to reduce power reflection at the interfaces of the transmission lines and to ensure proper power delivery.

In some embodiments, circuitry 300 further includes a fourth capacitor 308 electrically connected between the first electrode 101 and a current amplifier 310, and further connected to a ground 309. Fourth capacitor 308 can have slightly different requirements from the other capacitors, such as the first and third capacitors 327, 305. For example, the fourth capacitor's 305 function can be to anchor the source output to ground at high frequencies, filtering out all high frequency near the device's 301 output and reducing reflections to the detector. Fourth capacitor 308 should have negligible impedance in the frequency range of interest (e.g., the frequency range of device 301) but the impedance ought to be the lowest compared to the sample/graphene 103 and the input of the current preamplifier 310, which can have an impedance of 20Ω in the sensitivity setting commonly used, e.g., 1 μA per Volt, in its output. In some embodiments, the current amplifier 310 can be a low-noise current preamplifier from DL Instruments, e.g., model 1211, and can be capable of measuring currents as low as 10 pA. The first current amplifier 310 can be electrically connected to a second current amplifier 321 which can be a lock-in amplifier and further can be connected to ground 322 and is capable of providing an output reading of the vibration frequency of the high-transconductance layer 103. The lock-in amplifier 321 can be a Stanford Research Systems model SR830, and further can be capable of measuring low voltages coming from the current preamplifier 310, and also supplying a detection frequency as high as, e.g., 100 kHz.

Circuitry 300 can further include frequency mixer 320 for mixing the frequency of from HF voltage source 302 and second capacitor 319, which is electrically connected between frequency mixer 320 and the third (gate) electrode 106. The frequency mixer 320 can be, e.g., a model ZFM-3H from Mini-Circuits®, and can be capable of operating between 50-300 kHz. In one embodiment, the frequency mixer 320 can be used to generate sidebands by multiplying the HF signal with the detection signal reference. The result is the frequencies f+/−df. The pure component df at the reference signal frequency is generated by the device 301 after multiplying the frequencies f and f+/−df, along with other high frequency components. Further, the second capacitor 319 can have any appropriate capacitance depending on the particular application of the fabricated device, and in one exemplary embodiment, has the same characteristics as capacitors 305, 312, and 327.

In some embodiments, circuitry 300 can further include a fifth capacitor 312 electrically connected between second voltage source 317 ($V_g$) and the third (gate) electrode 106 and further connected, in series, to a fourth resistor 313 and a ground 314. The fifth capacitor 312 can have any appropriate capacitance depending on the particular application of the fabricated device, and in one exemplary embodiment, has the same characteristics as capacitors 305, 319, and 327. Further, the fourth resistor 313 can have any appropriate resistance depending on the particular application of the fabricated device, for example, 1-100 n in one exemplary embodiment. In one embodiment, the resistance of the fourth resistor 313 matches that of resistors 304 and 306, e.g., 50Ω. Circuitry 300 also includes a third (e.g., gate) voltage source 317 ($V_g$) which is electrically connected between the first capacitor 319 and the third (gate) electrode 106 and can further be connected to a ground 318. In some embodiments, gate voltage source 317 ($V_g$) can provide an AC source or a DC source depending on the particular application, and in a embodiment gate voltage source 317 ($V_g$) provides a DC source as illustrated in FIG. 3. In some embodiments, gate voltage source 317 ($V_g$) can further be electrically connected to a fifth resistor 316 and second inductor 315. The fifth resistor 316 can have any appropriate resistance depending on the particular application of the fabricated device, for example, 1-100Ω in one exemplary embodiment. In one embodiment, the resistance of the fifth resistor 316 can have a resistance that corresponds to the resistance of the DC voltage source 317 ($V_g$), which in some embodiments can be negligible compared to any resistance that comes after the series, such that the voltage at the output is constant. The second inductor 315 can have any appropriate inductance depending on the particular application of the fabricated device, for example, 1 mH in one exemplary embodiment, and can further be determined similar to the first inductor 323, discussed above. Further as illustrated in FIG. 3, the high-transconductance layer 103 and gate electrode 106 can have a capacitance of $C_g$, which is some embodiments can be estimated from the capacitance of a parallel-plate capacitor, $$C_g = k\varepsilon_0 \frac{A}{d},$$

where k is the effective dielectric constant between the material/graphene 103 and the substrate 107, $\varepsilon_0$ is the dielectric permittivity of vacuum (equal to $8.85 \times 10^{-12}$ F/m, A is the area of the sample over the substrate, and d is the distance between the two planes. For a 1 micron square sheet in vacuum, with d=300 nm (typical thickness of oxide removed in one embodiment), with k=1 for air/vacuum, then $C_g$=30 aF, where a=atto=$10^{-18}$.

FIG. 4 illustrates a method 400 for fabricating a device in accordance with the disclosed subject matter. Method 400 includes forming 410 a substrate, e.g., a silicon substrate, which can be performed by any technique known in the art, e.g., a float-zone technique as is known in the art to produce high-resistivity silicon wafers. Further, method 400 can also include depositing 420 a third electrode on the substrate. The third electrode can be deposited 420 by any technique known in the art, such as electron beam lithography, chemical vapor deposition, etc., depending on the material used for the third electrode. Further, the third electrode can include, for example, gold or gold layered onto another metal for adhesive purpose, e.g., chromium. Metals such as aluminum, copper, titanium or other metals appropriate for use in the semiconductor arts can also be used, as can non-metal conducting substances.

In some embodiments, depositing 420 a third electrode can include submerging the third electrode completely beneath, or partially into, the surface of the substrate. In other exemplary embodiments, the third electrode can be deposited 420 across the entire, or substantially all of the, substrate surface. In yet other embodiments where the substrate includes at least a partially conducting material, e.g., silicon, depositing 420 the third electrode can be omitted all together and the substrate itself can serve as the third electrode. However, even in those embodiments where the substrate includes at least a partially conducting material, e.g., silicon, the third electrode can still be deposited 420 in a localized manner, e.g., only in the area where the intended device is to be located (a local gate electrode), or across the entire substrate surface to form a global gate electrode.

In some embodiments, depositing 420 the third electrode can be performed after a first deposition 430 of a first layer of etchable material. In other embodiments, the third electrode can be deposited 420 after deposition 470, 480 of the first and second electrodes and an additional deposition of to the etchant, discussed in more detail below and with reference to FIGS. 6(a)-(f). In addition, some embodiments also envision patterning 425 the third electrode to a desired shape depending on the particular application for the fabricated electromechanical device, as discussed in more detail above. The third electrode can be patterned 425 utilizing any technique known in the art, e.g., any lithography technique, to create the desired shape. In one exemplary embodiment, the third electrodes can be deposited 420 and 425 in one process, e.g., utilizing electron beam lithography.

As illustrated in FIG. 4, an etchable material is deposited 430 on the surface of the substrate base. In some embodiments, the substrate of the fabricated device can include one or more layers of etchable material that are completely removed by the exposure 490 of the surface to an etchant, as is discussed in further detail below with reference to FIGS. 5(*a*)-(*f*). In those embodiments where the first electrode is deposited 420 across the entire, or substantially all of, the surface of the substrate, the etchable material can be deposited 430 substantially or entirely on the surface of the third electrode, while in those embodiments where the third electrode is deposited 420 locally, the etchable material can be deposited 430 on the third electrode and the surface of the substrate (which itself can include a layer of etchable material previously deposited 430). Similarly, in those embodiments where the third electrode is completely submerged 420 in the substrate surface, the etchable material will be deposited entirely on the substrate surface.

In some exemplary embodiments, method 400 can further include forming 440 at least one layer of graphene. In other embodiments, the at least one layer of graphene can be acquired pre-formed. In those embodiments including forming 440 the at least one layer of graphene, it can be formed 440 by any technique known in the art, such as mechanical exfoliation, e.g., using adhesive tape to remove graphene flakes from a stock of graphite. Other techniques include chemical exfoliation of graphene, whereby a stock of graphite is chemically dissolved into individual layers or even small stacks of monolayers, then spread onto the etchable surface and dried. Also a chemical vapor deposition technique can be employed wherein graphene layers are grown onto metals, such as nickel or copper, and then the metals are chemically dissolved and the graphene layers can be transferred to the etchable surface.

Method 400 further includes depositing 450 one or more layers of graphene onto the surface of the etchable material. In some exemplary embodiments, this can be accomplished during the formation 440 of the one or more layers of graphene. For example, the chemical exfoliation technique envisions spreading, or spraying, the dissolved graphene onto the surface of the etchable material, which will accomplish depositing 450 the graphene layers as well. Similarly, a chemical vapor deposition technique also envisions transferring 450 the one or more layers of graphene to the etchable surface after chemically dissolving the electrodes the graphene was formed 440 on. The graphene can be mechanically deposited 450 onto the surface of the etchable material utilizing, for example, an adhesive tape or the like.

The method 400 further includes patterning 460 the graphene layers into desired shapes, useful for particular applications, e.g., nanoelectromechanical devices such as micro-mirrors and accelerometers, small switches, oscillators, resonators, etc. In some exemplary embodiments, the graphene layers can be patterned 460 into nano-ribbons having widths of, e.g., 10-200 nm, and lengths of, e.g., 0.1-3 µm. Other embodiments can have graphene layers patterned 460 into rectangular shapes having a width of 0.5-2 µm on each side, though larger and small sizes are possible. The various upper and lower size limits for the graphene flakes are discussed in more detail above. Patterning 460 the graphene layers can be performed either before or after the deposition 450 of the graphene layers onto the etchable surface. Further, the graphene layers can be patterned 460 utilizing any appropriate technique known in the art. For example, the graphene flakes can be patterned 460 by oxygen plasma etching, e.g., for 6 seconds at 50 W and 200 mT, to create the required shapes for a given application. The graphene layers can also be patterned 460 utilizing lithographic techniques, such as photolithography or other kinds of lithography.

In some embodiments, method 400 further includes depositing 470 a first electrode on the etchable material such that at least a first portion of the at least one layer of graphene is covered by the first electrode and at least a portion of the first electrode is directly in contact with the etchable material. The method also includes deposition 480 a second electrode on the etchable material such that at least a second portion of the at least one layer of graphene is covered by the second electrode and at least a portion of the second electrode is directly in contact with the etchable material. In one exemplary embodiment, the first and second electrodes can be deposited utilizing techniques well known in the art, such as metal evaporation, e.g., in a vacuum utilizing an electron-beam assist or thermal assist, or sputtering, or electro-deposition. Further, the first or second electrodes can include, for example, gold or gold layered onto another metal for adhesive purpose, e.g., chromium. Metals such as aluminum, copper, titanium or other metals appropriate for use in the semiconductor arts can also be used, as can non-metal conducting substances.

In an exemplary embodiment, the first and second electrodes can be patterned 475, 485 into appropriate shapes for the particular application. Importantly, the first and second electrodes should not be touching and further each should be deposited 470, 480 and/or patterned 475, 485 such that the first and second electrodes each cover at least a portion of the graphene layer, respectively. In addition, the first and second electrodes should be deposited 470, 480 and/or patterned 475, 485 such that at least a portion of each is directly in contact with the etchable material surface, e.g., the silicon dioxide. Such a configuration will ensure that some etchable material, e.g., silicon dioxide, remains un-etched beneath the portions of the first and second electrodes directly in contact with the silicon dioxide, thus forming the first and second support structures, respectively, that will support the first and second electrodes above the substrate, e.g., the silicon or silicon dioxide layered on silicon. The unique feature of graphene that permits etching to occur beneath the graphene layers can then result in a layer of graphene that is suspended above the substrate. Such resulting configuration is additionally due to the fact that the graphene will adhere to the underside of the first and second electrodes due to van der Waals force.

Method 400 further includes exposing 490 the etchable material to an etchant, for example, hydrofluoric acid, to remove the etchable material around the first and second layers of metal and underneath the at least one layer of graphene, thereby fabricating an electromechanical device having at least one layer of graphene suspended above the substrate. The etching 490 can be performed utilizing any known technique in the art, such as vapor phase etching or liquid etching using a buffered oxide etchant which, in one embodiment, can be diluted in water (e.g., at a 50:1 ratio of water to etchant). The etching 490 technique employed will determine the rate that the etchable material is removed. For example a vapor phase etching technique utilizing hydrofluoric acid can remove silicon oxide at a rate of about 1 nm/min if the silicon oxide surface is heated to 60° C. A buffered oxide etching technique can, for example, remove silicon oxide at a rate of about 10 nm/min by exposing 490 the surface to a solution of hydrofluoric acid diluted in water to a ratio of 50:1.

In some embodiments, a second layer of etchable material can be deposited 430 on top of the first and second electrodes and prior to the deposition 420 of the third electrode. The third electrode can then be deposited 420 on top of the second layer of etchable material, which itself is layered on top of the first and second electrodes and the at least one layer of graphene. In such an embodiment, the third electrode can be deposited 420 substantially over the at least one layer of graphene, but must have at least a portion that is not directly over the graphene layer to serve as a supporting member after exposure 490 of the device to an etchant. The entire device can then be exposed 490 to an etchant to remove some portions of the etchable material, except those portions in direct contact with the first, second or third electrodes and not also in contact with the at least one layer of graphene. One exemplary embodiment having such a configuration is discussed in more detail below with reference to FIGS. 6(a)-(f).

Figure 5A:
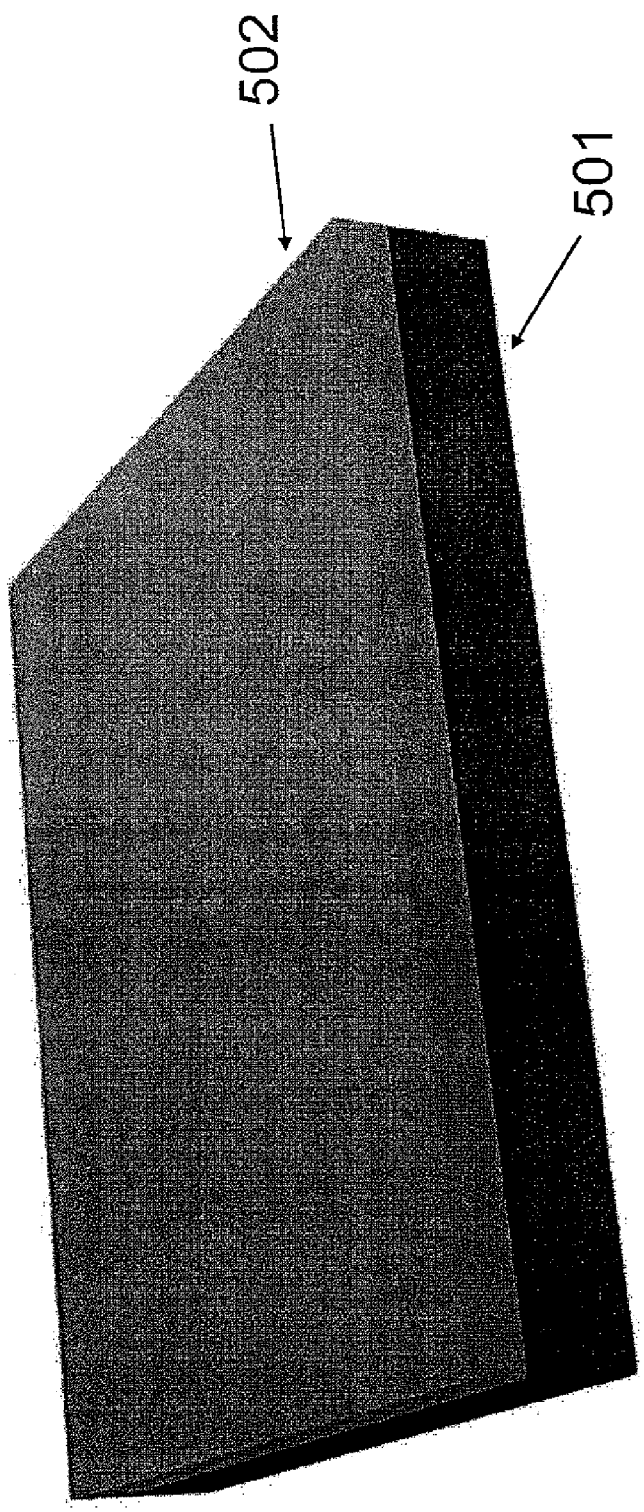
FIGS. 5(a)-(f) illustrate a process for fabricating an electromechanical device in accordance with an exemplary embodiment of the disclosed subject matter.
Figure 5B:
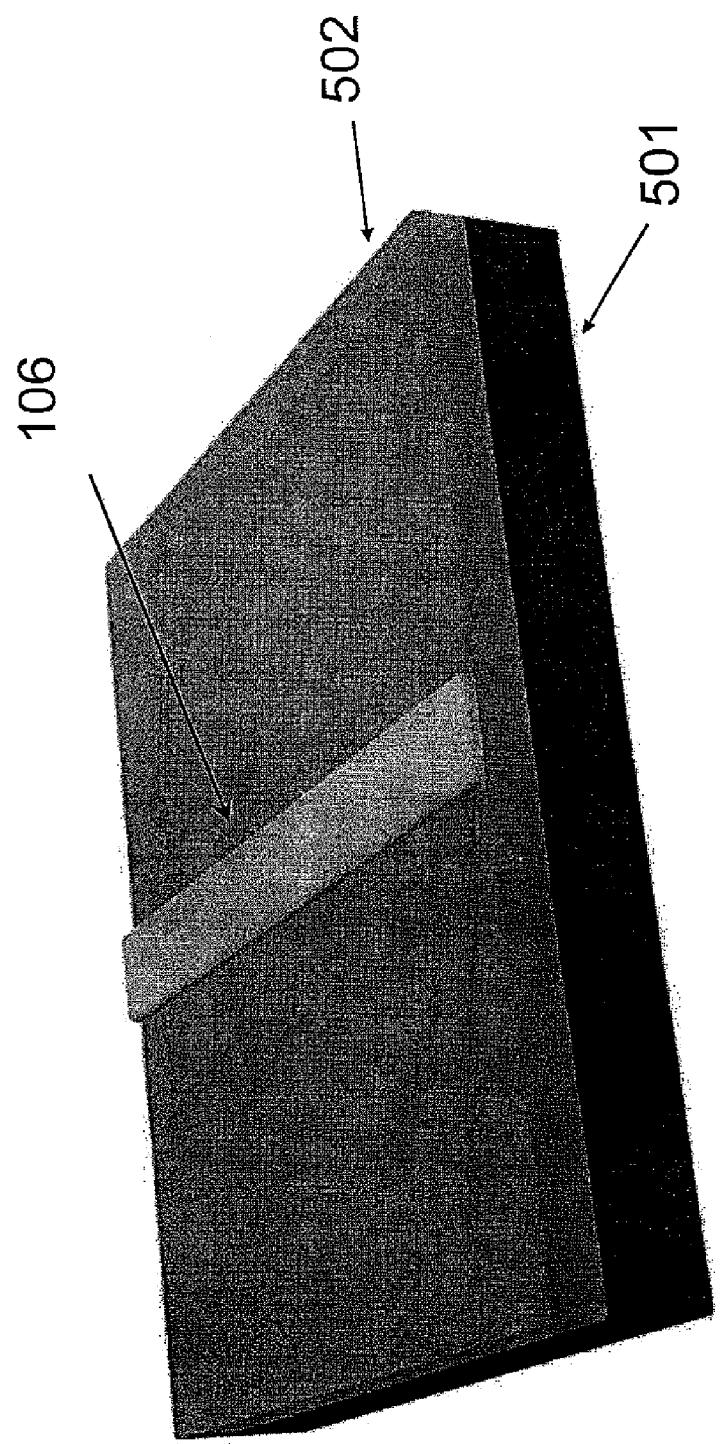

FIGS. 5(a)-(f) illustrate an exemplary process for fabricating an electromechanical device 500 having a localized gate electrode located below a suspended layer of graphene in accordance with the disclosed subject matter. As illustrated in FIG. 5(a), a substrate base 501 is formed 410 and a first layer of etchable material 502 is deposited 430 thereon. In one exemplary embodiment the substrate base 501 is composed of high resistivity silicon and the first layer of etchable material 502 is composed of silicon dioxide, though those skilled in the art will understand other materials can be utilized. FIG. 5(b) illustrates the deposition 420 of the third electrode (e.g., the gate electrode) 106 onto the surface of the first layer of etchable material 502. In one exemplary embodiment, the gate electrode 106 is composed of gold and, in the same or another embodiment can be deposited 420 using electron beam lithography, as is known in the art. Further, the gate electrode 106 can be patterned 425 utilizing techniques known in the art, e.g., lithography, and in some embodiments, depositing 420 and patterning 425 the third (gate) electrode 106 can be performed in one process, e.g., utilizing electron beam lithography.

Figure 5C:
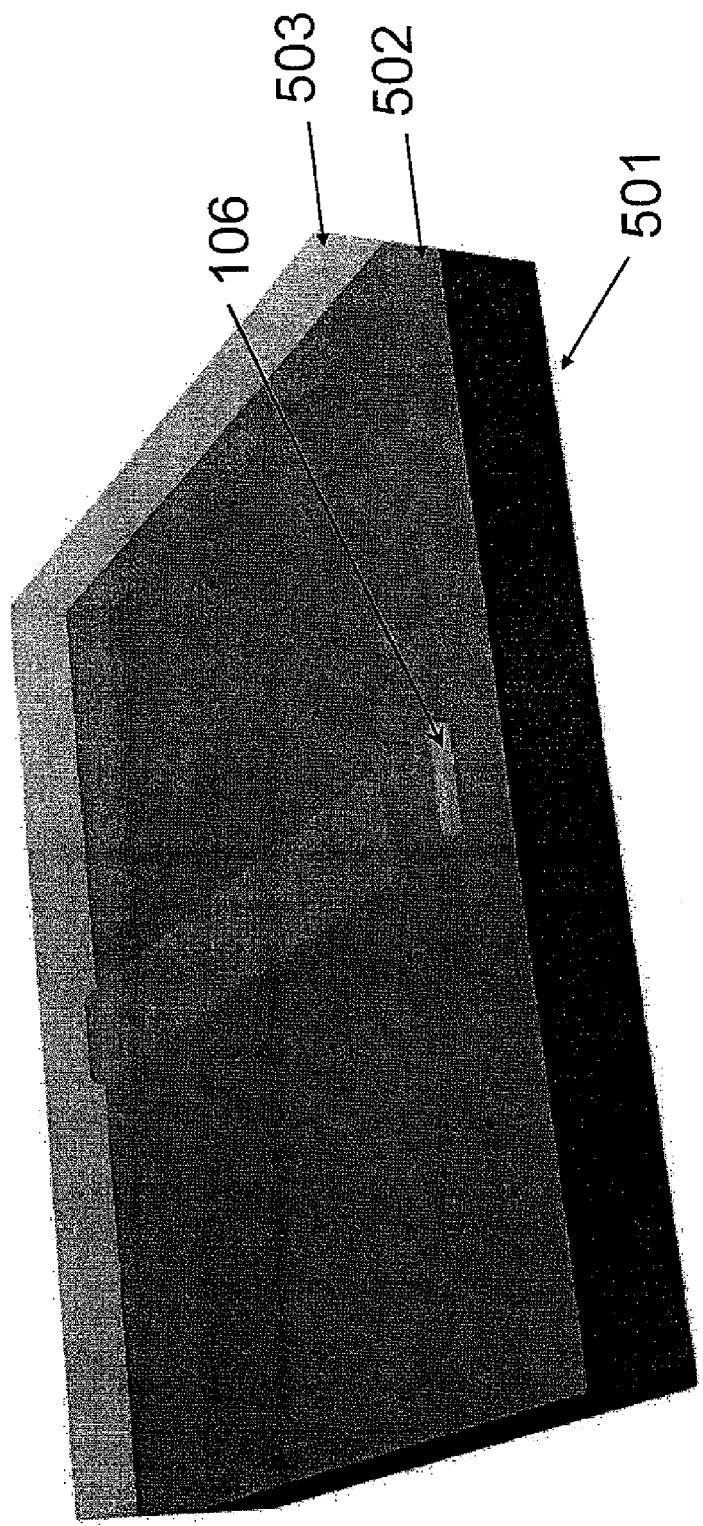
Figure 5D:
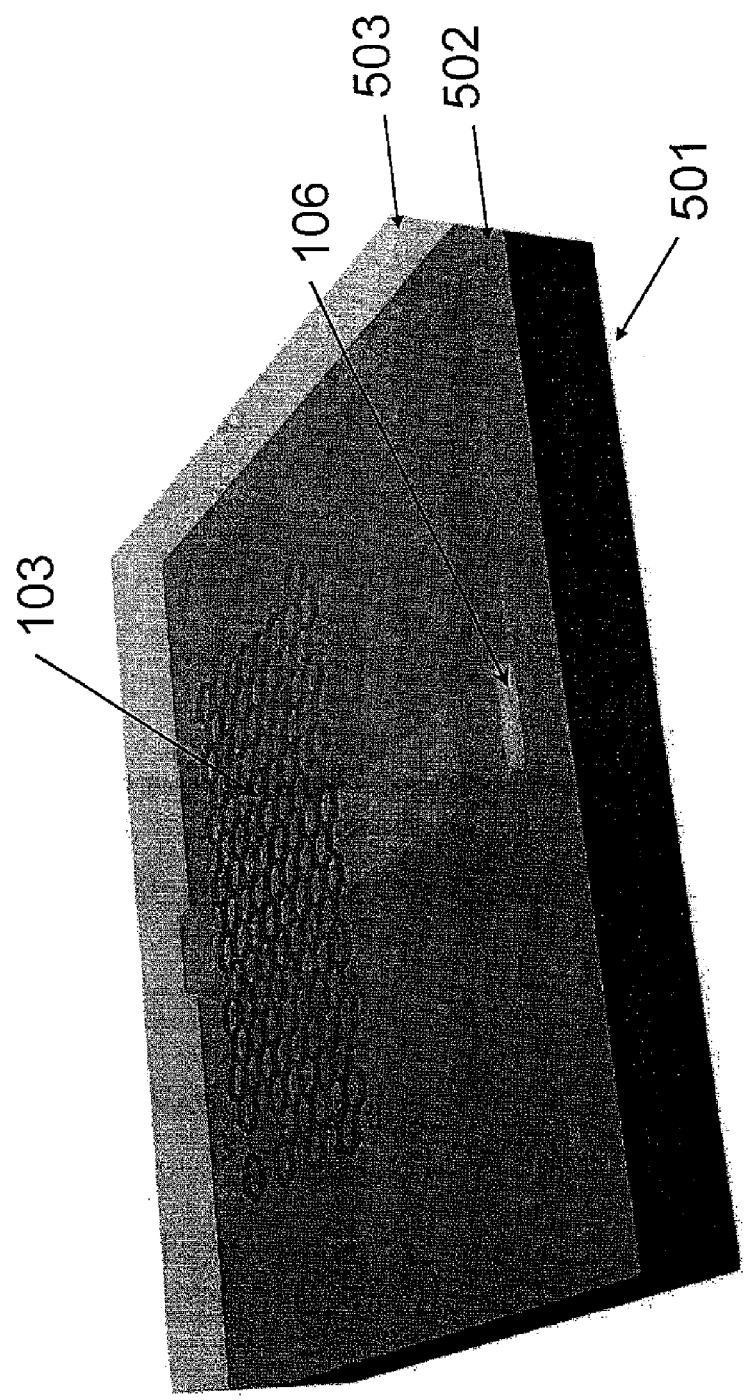

FIG. 5(c) illustrates the deposition 430 of a second layer of etchable material 503 on top of the first layer 502 and the third electrode 106. In one exemplary embodiment, the second layer of etchable material 503 is composed of silicon dioxide, though those skilled in the art will understand other materials suitable for etching can be employed. FIG. 5(d) illustrates the deposition 450 of at least one layer of high-transconductance material (e.g., graphene) 103 on the surface of the second layer of etchable material 503.

Figure 5E:
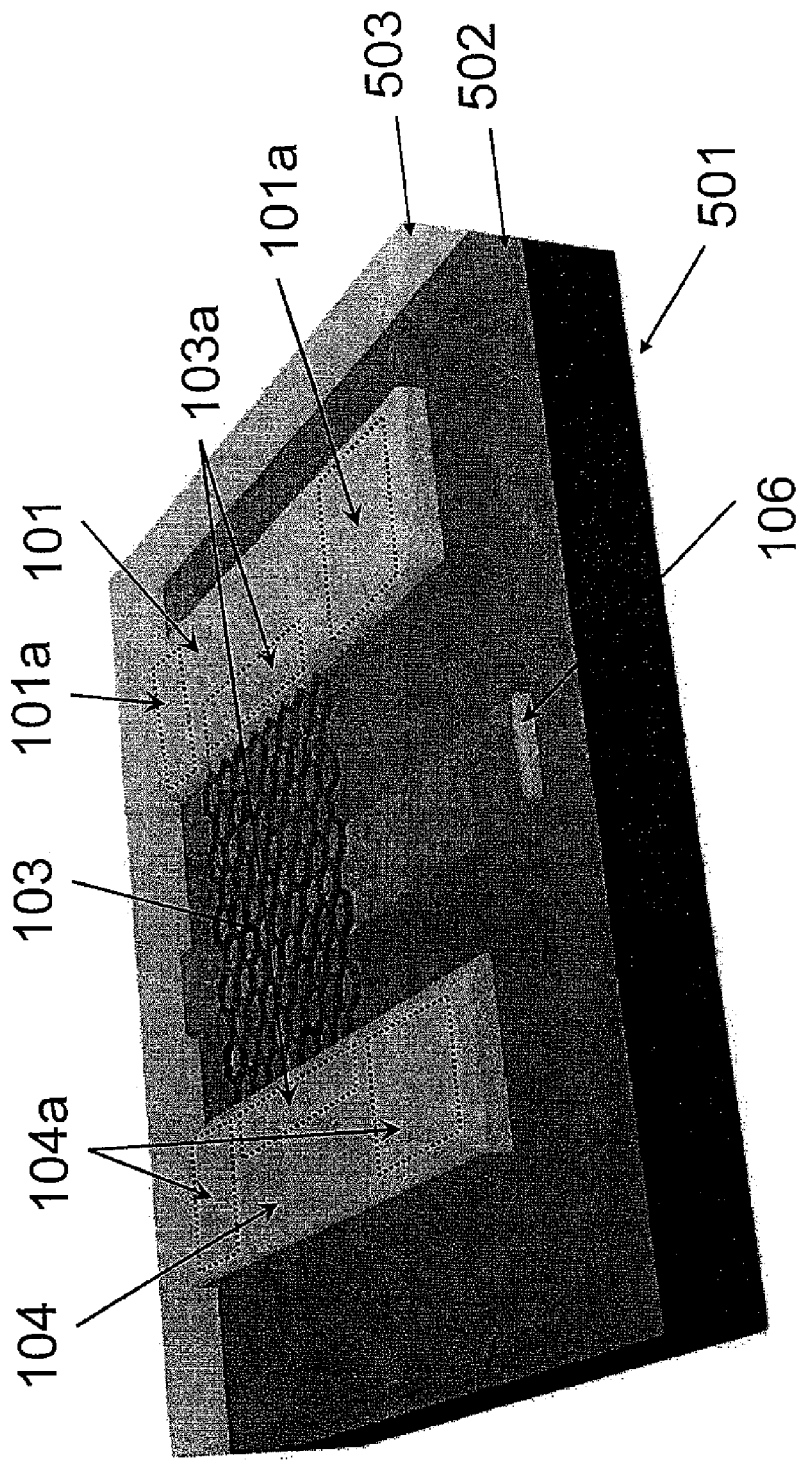

FIG. 5(e) illustrates the deposition 460, 470 of the first and second electrodes 101, 104. In some embodiments, the first and second electrodes 101, 104 can be deposited 460, 470 utilizing any technique known in the art, such as electron beam lithography. Further, the first and second electrodes 101, 104 can be patterned 465, 475 utilizing any technique known in the art, e.g., any lithography technique, to create the desired shape of the first and second electrodes 101, 104. In one exemplary embodiment, the first and second electrodes 101, 104 can be deposited 460, 470 and 465, 475 in one process, e.g., utilizing electron beam lithography. The first and second electrodes 101, 104 can also be formed from any substance suitable for use as an electrode, such as gold, aluminum, copper, titanium, etc. FIG. 5(e) further illustrates that the first and second electrodes 101, 104 are deposited 460, 470 and/or patterned 465, 475 such that each covers at east a portion 103a of the graphene layer 103 and also such that at least a portion 101a, 104a of each electrode 101, 104 is in contact with the etchable layer 503.

Figure 5F:
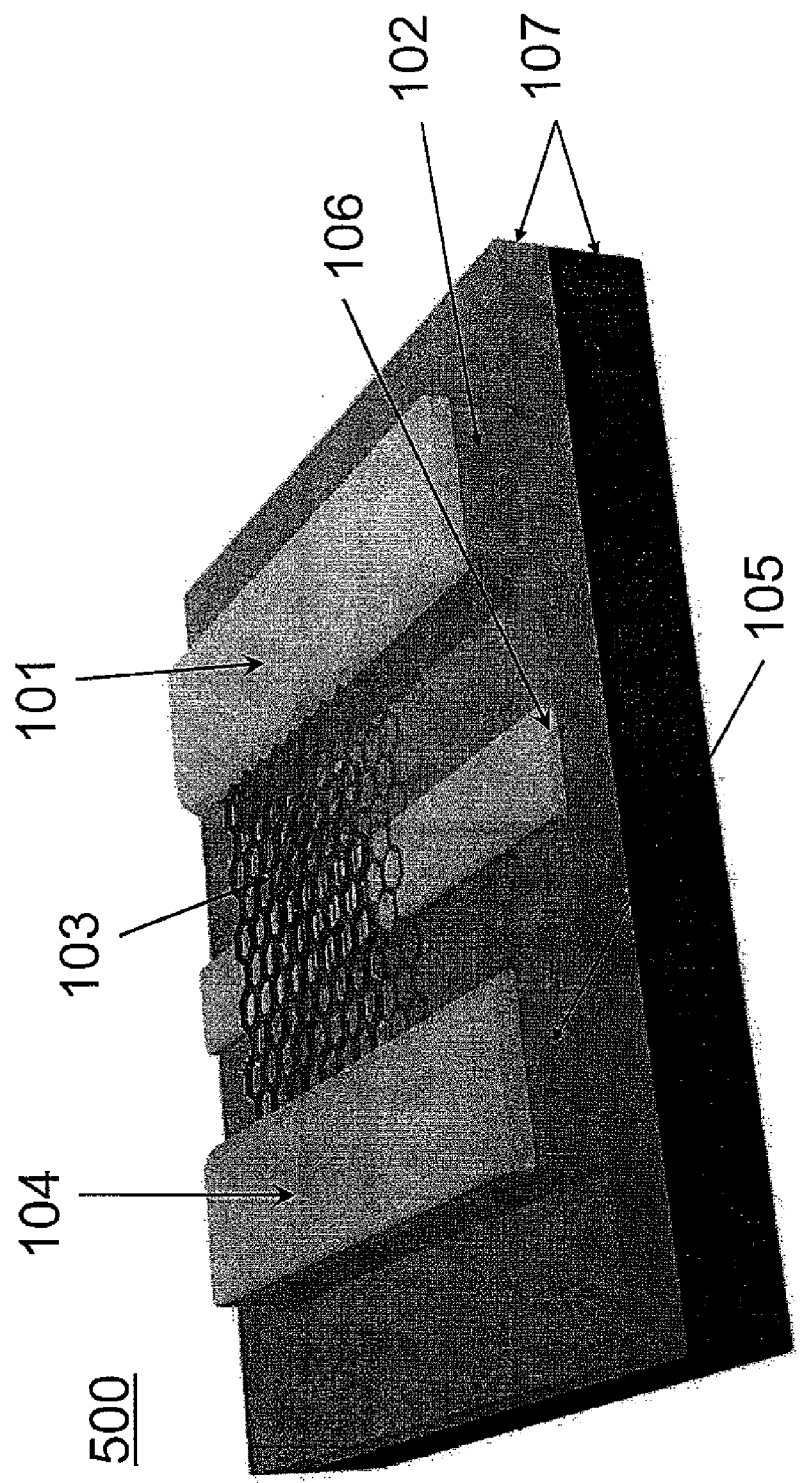

FIG. 5(f) illustrates a fabricated electromechanical device 500 after exposure 490 to an etchant, e.g., hydrofluoric acid. As illustrated in FIG. 5(f), the etchant etched away the exposed portions of the second layer of etchable material 503 such that the third electrode 106 was uncovered and the etchant further removed the second layer of etchable material 503 underneath the graphene layer 103, including those portions 103a of the graphene layer 103 covered by the first and second electrodes 101, 104, thus resulting in a layer of graphene 103 suspended above the substrate 107, which as illustrated in FIG. 5(f) includes the substrate base layer (e.g., the silicon layer) 501 and the first layer of etchable material (e.g., the first silicon dioxide layer) 502. Further illustrated in FIG. 5(f) are the support members 102, 105, which have been formed, in this exemplary embodiment, from the second layer of etchable material (e.g., the second silicon dioxide layer) 503 at the portions 101a, 104a of that layer 503 that were directly covered electrodes 101, 104. Such a result is due to the fact that the etchant will not diffuse beneath the electrodes 101, 104, while it will diffuse beneath the graphene layer 103.

Figure 5G:
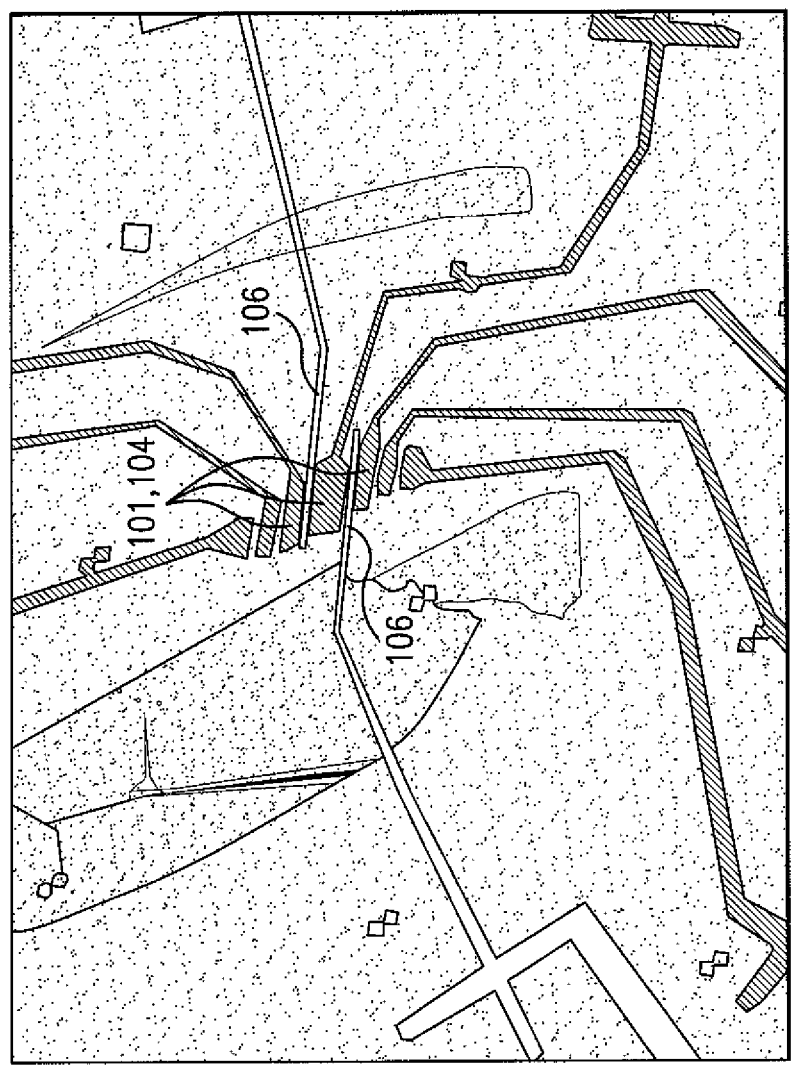
FIG. 5(g) is a top-view image of a series of fabricated electromechanical devices in accordance with an exemplary embodiment of the disclosed subject matter.

FIG. 5(g) is an image of a series of fabricated devices 500 having first and second electrodes 101, 104 and local gate electrodes 106 located between the first and second electrodes 101, 104 and beneath suspended graphene layers 103 (not visible).

Figure 6A:
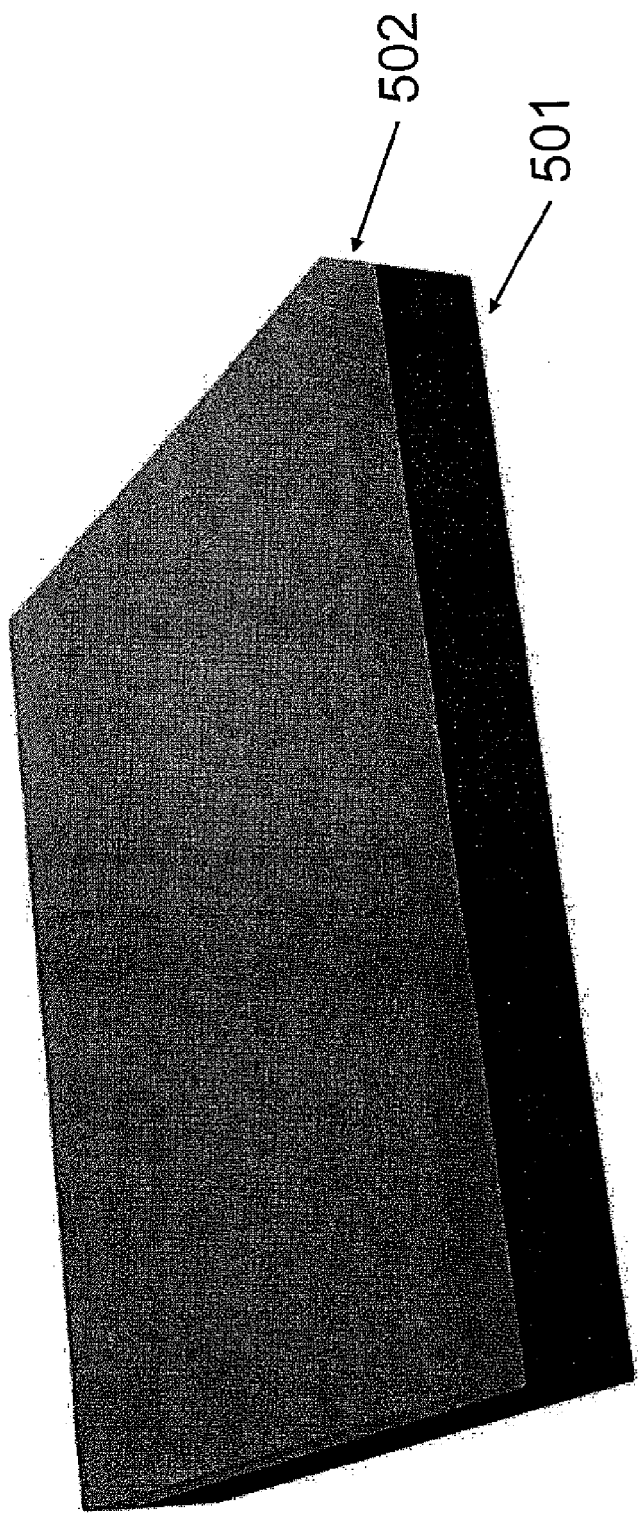
FIGS. 6(a)-(f) illustrate a process for fabricating an electromechanical device in accordance with an exemplary embodiment of the disclosed subject matter.

FIGS. 6(a)-(f) illustrate an exemplary process for fabricating an electromechanical device 600 having a localized gate electrode suspended above a suspended layer of graphene in accordance with the disclosed subject matter. As illustrated in FIG. 6(a), a substrate base 501 is formed 410 and a first layer of etchable material 502 is deposited 430 thereon. In one exemplary embodiment the substrate base 501 is composed of high resistivity silicon and the first layer of etchable material 502 is composed of silicon dioxide, though those skilled in the art will understand other materials can be utilized.

Figure 6B:
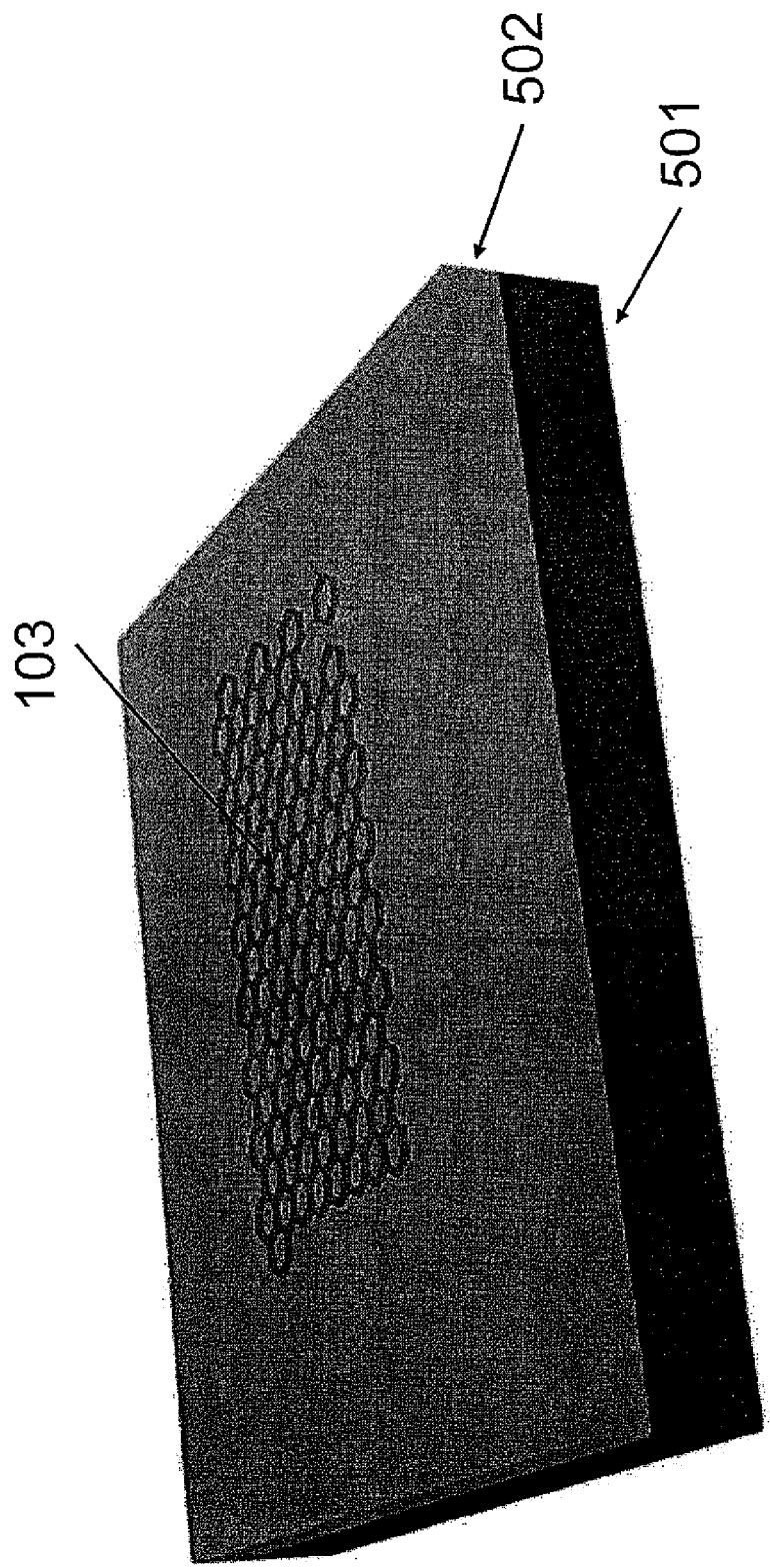

FIG. 6(b) illustrates the deposition 450 of at least one layer of high-transconductance material (e.g., graphene) 103 on the surface of the first layer of etchable material 502.

Figure 6C:
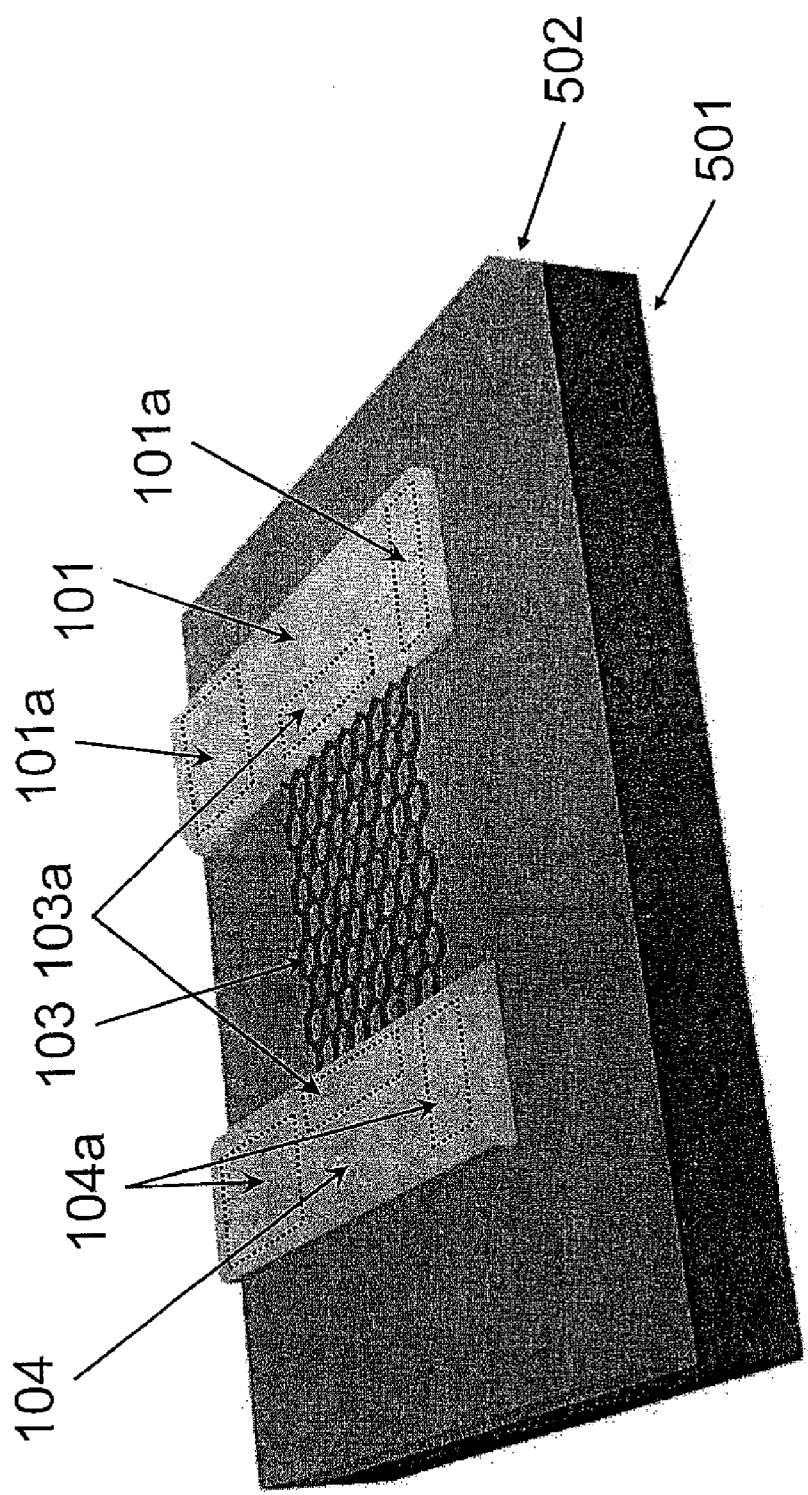

FIG. 6(c) illustrates the deposition 460, 470 of the first and second electrodes 101, 104. In some embodiments, the first and second electrodes 101, 104 can be deposited 460, 470 utilizing any technique known in the art, such as electron beam lithography. Further, the first and second electrodes 101, 104 can be patterned 465, 475 utilizing any technique known in the art, e.g., any lithography technique, to create the desired shape of the first and second electrodes 101, 104. In one exemplary embodiment, the first and second electrodes 101, 104 can be deposited 460, 470 and 465, 475 in one process, e.g., utilizing electron beam lithography. The first and second electrodes 101, 104 can also be formed from any substance suitable for use as an electrode, such as gold, aluminum, copper, titanium, etc., as well as conducting non-metallic substances. FIG. 6(c) further illustrates that the first and second electrodes 101, 104 are deposited 460, 470 and/or patterned 465, 475 such that each covers at least a portion 103a of the graphene layer 103 and also such that at least a portion 101a, 104a of each electrode 101, 104 is in contact with the first etchable layer 502.

Figure 6D:
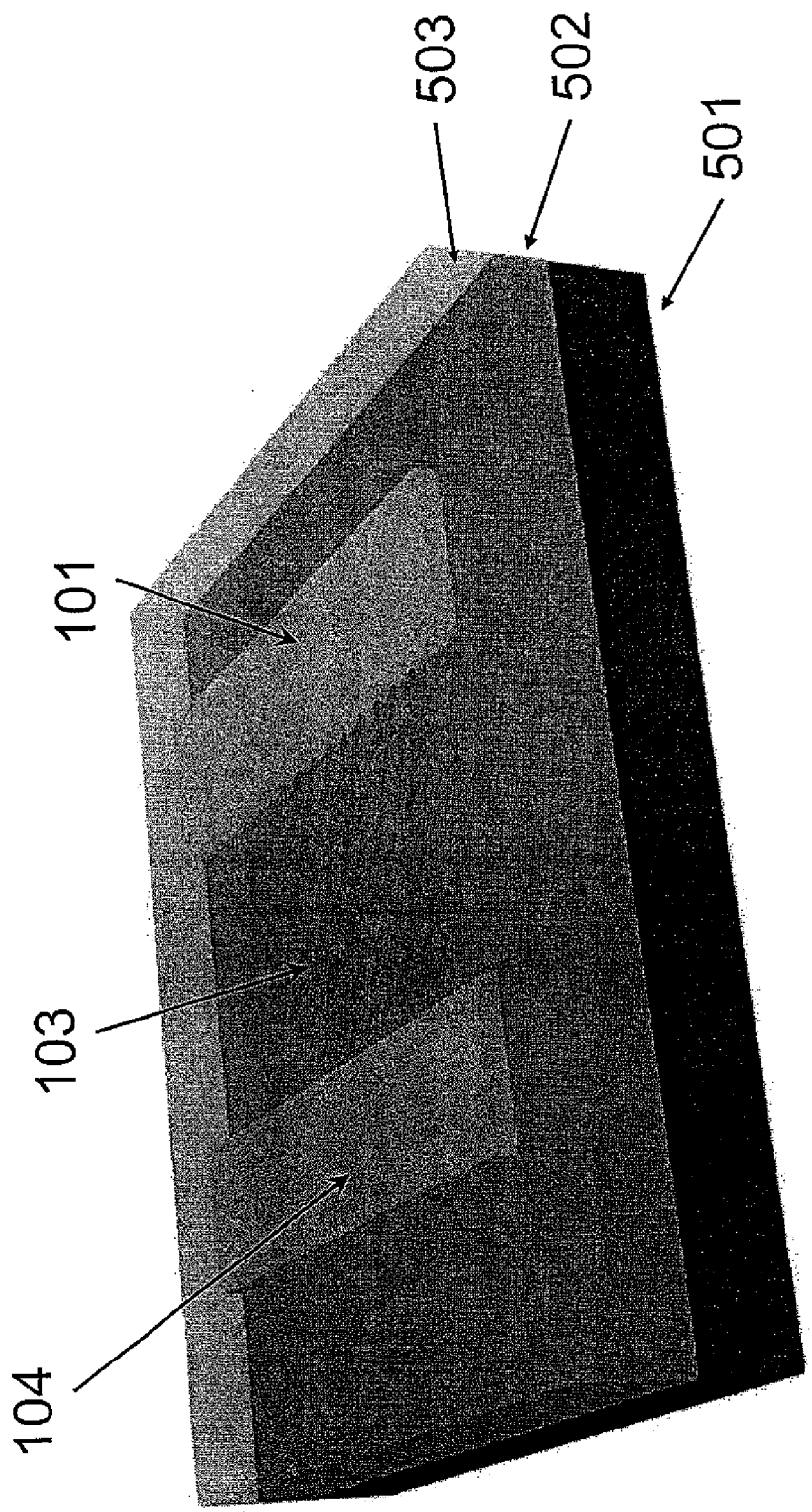

FIG. 6(d) illustrates the deposition 430 of a second layer of etchable material 503 on top of the first layer 502 and the first and second electrode 101, 104 and the at least one layer of graphene 103. In one exemplary embodiment, the second layer of etchable material 503 is composed of silicon dioxide, though those skilled in the art will understand other materials suitable for etching can be employed.

Figure 6E:
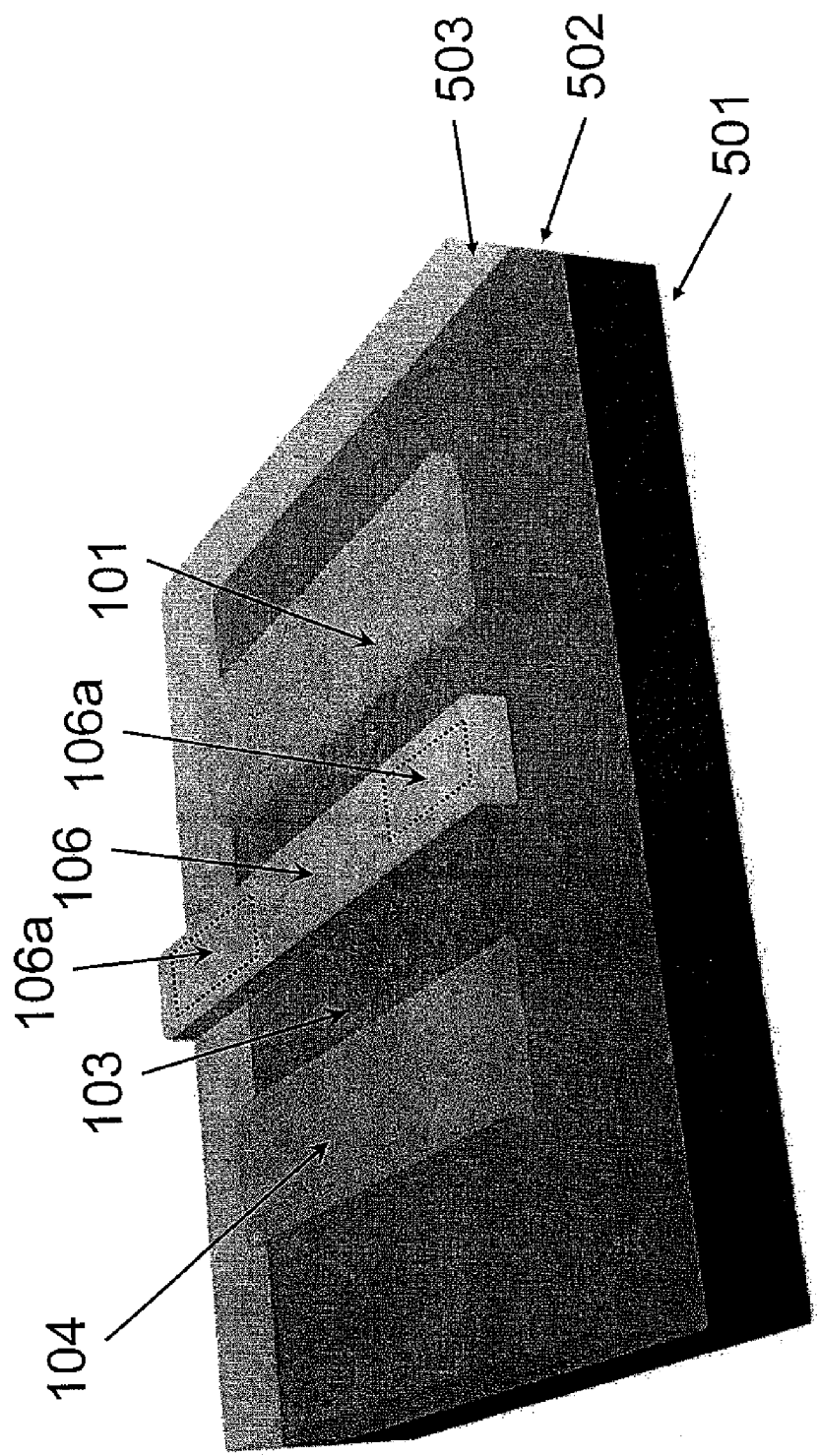

FIG. 6(e) illustrates the deposition 420 of the third electrode (e.g., the gate electrode) 106 onto the surface of the second layer of etchable material 503. In one exemplary embodiment, the gate electrode 106 is composed of gold and, in the same or another embodiment can be deposited 420 using electron beam lithography, as is known in the art. The third electrode 106 can also be formed from any substance suitable for use as an electrode, such as gold, aluminum, copper, titanium, etc., as well as conducting non-metallic substances. Further, the gate electrode 106 can be patterned 425 utilizing techniques known in the art, e.g., lithography, and in some embodiments, depositing 420 and patterning 425 the third (gate) electrode 106 can be performed in one process, e.g., utilizing electron beam lithography. FIG. 6(e) further illustrates that the third electrode 106 is deposited 420 such that one or more portions 106a are not directly above the at least one layer of graphene 103. Such a configuration, as noted above, can ensure that, after exposure 490 to an etchant that removes the etchable material from the first and second layers 502, 503 above and below the layer of graphene 103, at least some portion of the first and second layers 502, 503 remains to form at least one support member 108 to support the third electrode 106.

Figure 6F:
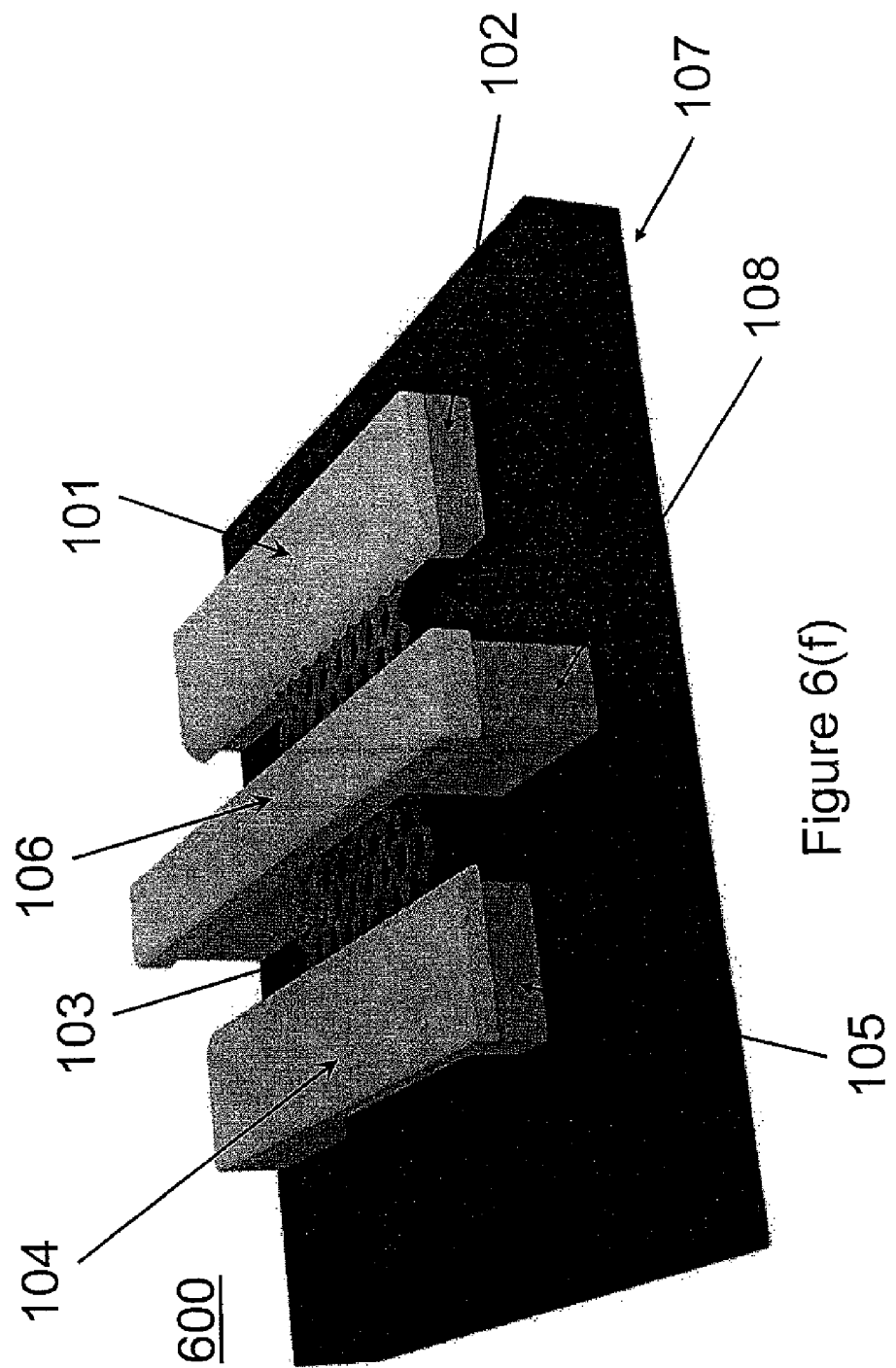

FIG. 6(f) illustrates a fabricated electromechanical device 600 after exposure 490 to an etchant, e.g., hydrofluoric acid. As illustrated in FIG. 6(f), the etchant etched away the exposed portions of the second layers of etchable material 503 such that the third electrode 106 was suspended above the graphene layer 103 and supported by supporting members 108, which was formed from the first and second layers 502, 503 of the etchant material directly below portions 106a. The etchant further removed the first layer of etchable material 502 underneath the graphene layer 103, including those portions 103a of the graphene layer 103 covered by the first and second electrodes 101, 104, thus resulting in a layer of graphene 103 suspended above the substrate 107, which as illustrated in FIG. 6(f) includes the substrate base layer (e.g., the silicon layer) 501. Further illustrated in FIG. 6(f) are the support members 102, 105, which have been formed, in this exemplary embodiment, from the first layer of etchable material (e.g., the first silicon dioxide layer) 502 at the portions 101a, 104a of that layer 502 that were directly covered electrodes 101, 104. Such a result is due to the fact that the etchant will not diffuse beneath the electrodes 101, 104, 106 while it will diffuse beneath the graphene layer 103.

Figure 6H:
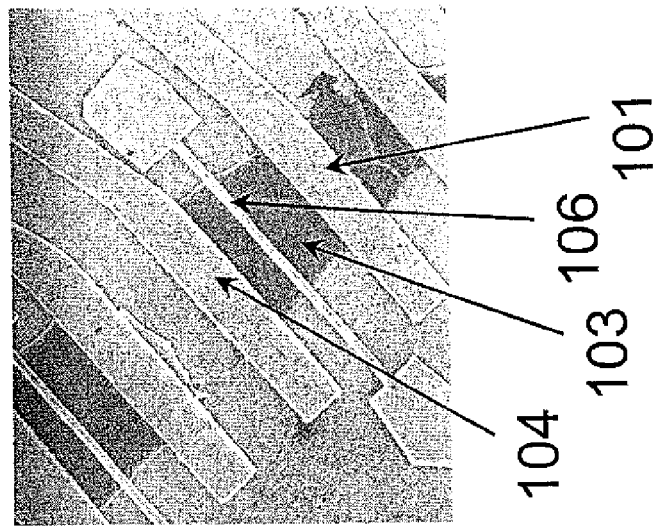
FIG. 6(h) is a top-view image of a series of fabricated electromechanical devices in accordance with an exemplary embodiment of the disclosed subject matter.
Figure 6G:
FIG. 6(g) is a side-view image of a fabricated electromechanical devices in accordance with an exemplary embodiment of the disclosed subject matter.

FIG. 6(g) is an side view scanning electron microscope image of a fabricated device 600 having first and second electrodes 101, 104 and local gate electrodes 106 located between the first and second electrodes 101, 104 and suspended above the suspended graphene layers 103. FIG. 6(h) is a top view image of the device in FIG. 6(g).

Figure 7A:
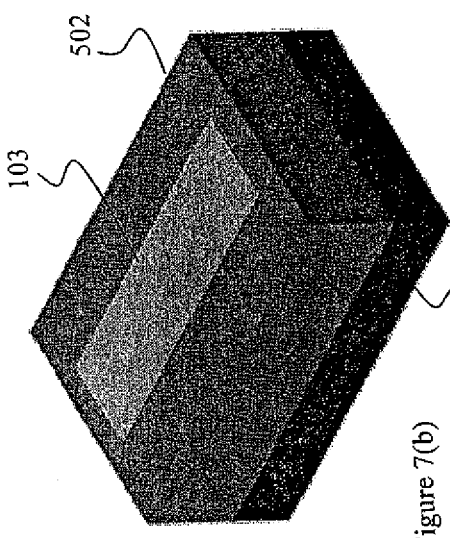
FIGS. 7(a)-(d) illustrate a process for fabricating an electromechanical device in accordance with an exemplary embodiment of the disclosed subject matter.

FIGS. 7(a)-(d) illustrate an exemplary process for fabricating an electromechanical device 700 having a global gate electrode configuration in accordance with the disclosed subject matter. As illustrated in FIG. 7(a), a substrate base 501 is formed 410 and a first layer of etchable material 502 is deposited 430 thereon. In one exemplary embodiment the substrate base 501 is composed of high resistivity silicon and the first layer of etchable material 502 is composed of silicon dioxide, though those skilled in the art will understand other materials can be utilized.

Figure 7B:
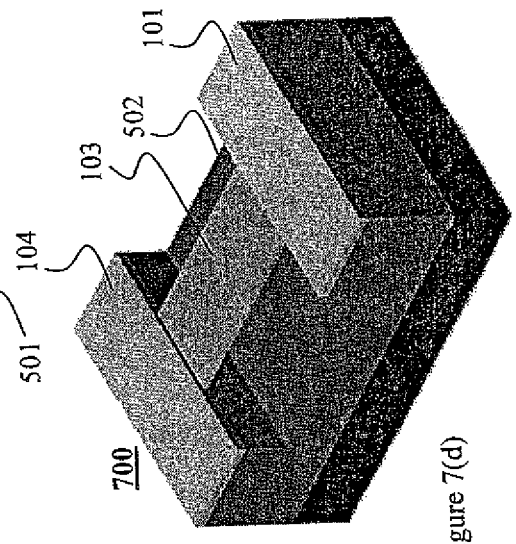
Figure 7C:
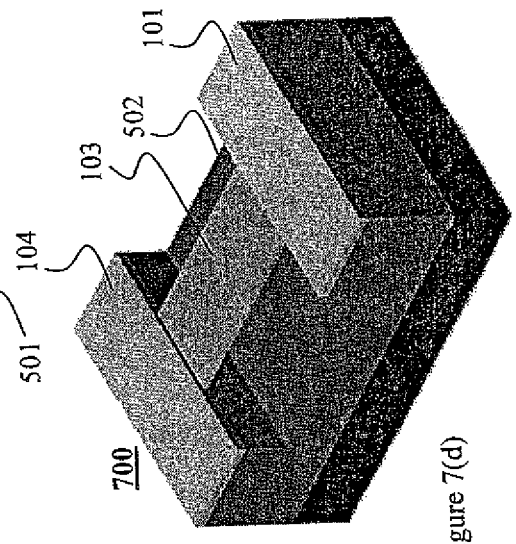
Figure 7D:
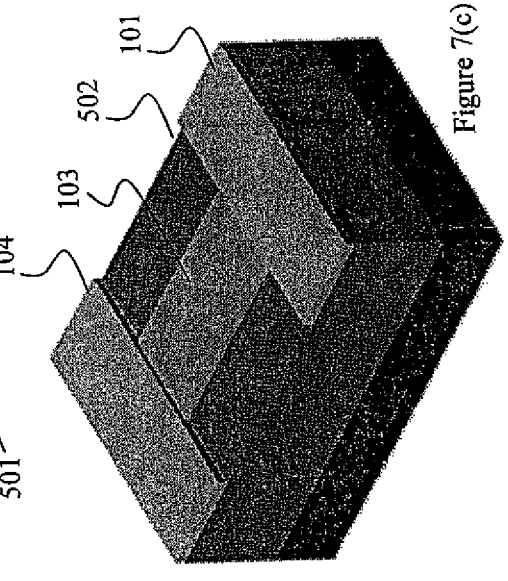

FIG. 7(b) illustrates the deposition 450 of at least one layer of high-transconductance material (e.g., graphene) 103 on the surface of the first layer of etchable material 502. FIG. 7(c) illustrates the deposition 460, 470 of the first and second electrodes 101, 104, which can also be patterned 465, 475 as discussed above with reference to FIG. 6(c). FIG. 7(d) illustrate an exemplary fabricated device 700 which includes at least one suspended layer of graphene 103 and where the silicon substrate 501 functions as global gate electrode.

Figure 7E:
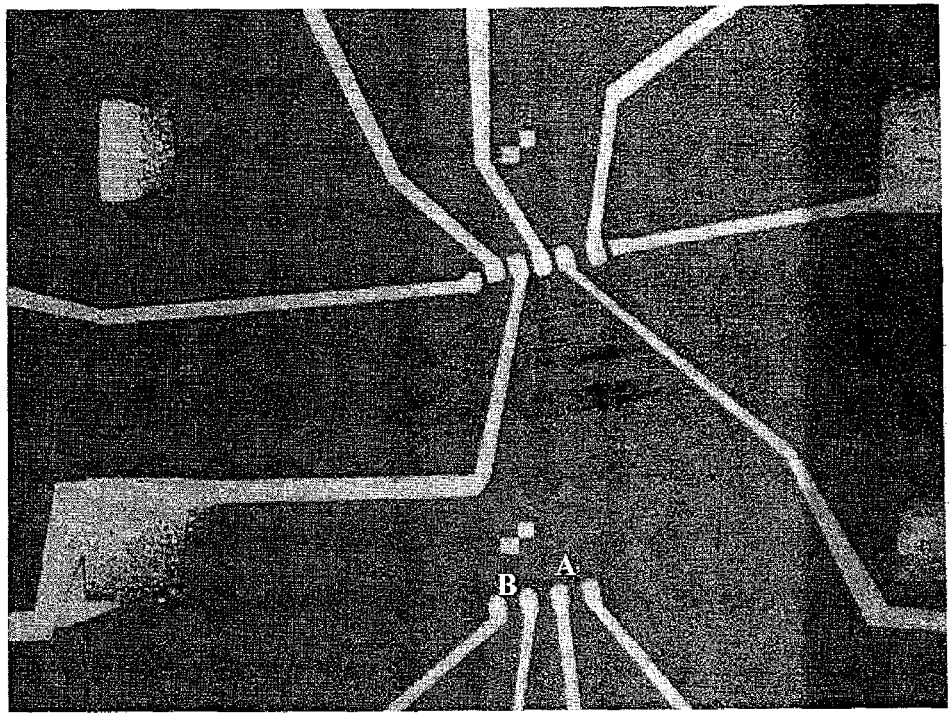
FIG. 7(e) is a top-view image of a series of fabricated electromechanical devices in accordance with an exemplary embodiment of the disclosed subject matter.

FIG. 7(e) is a top-view image of a series of fabricated electromechanical devices 700 having global gate electrodes.

Figure 7F:
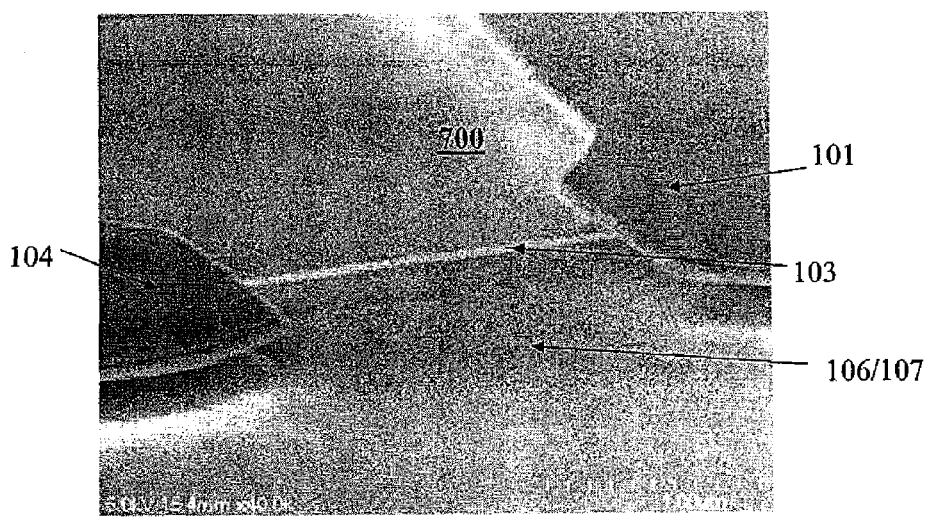
FIG. 7(f) is a side-view image of the fabricated electromechanical device at point A in FIG. 7(e) in accordance with an exemplary embodiment of the disclosed subject matter.
Figure 7G:
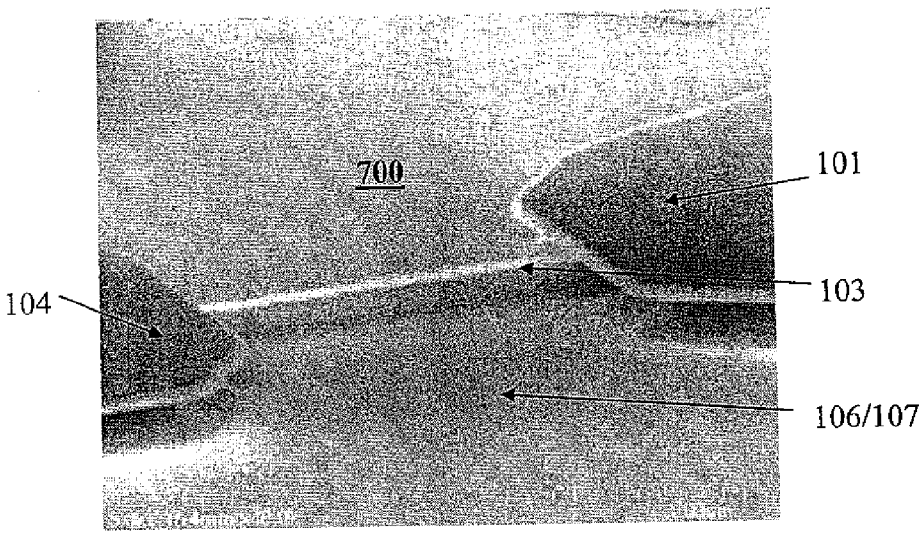
FIG. 7(g) is a side-view image of the fabricated electromechanical device at point B in FIG. 7(e) in accordance with an exemplary embodiment of the disclosed subject matter.
Figure 7H:
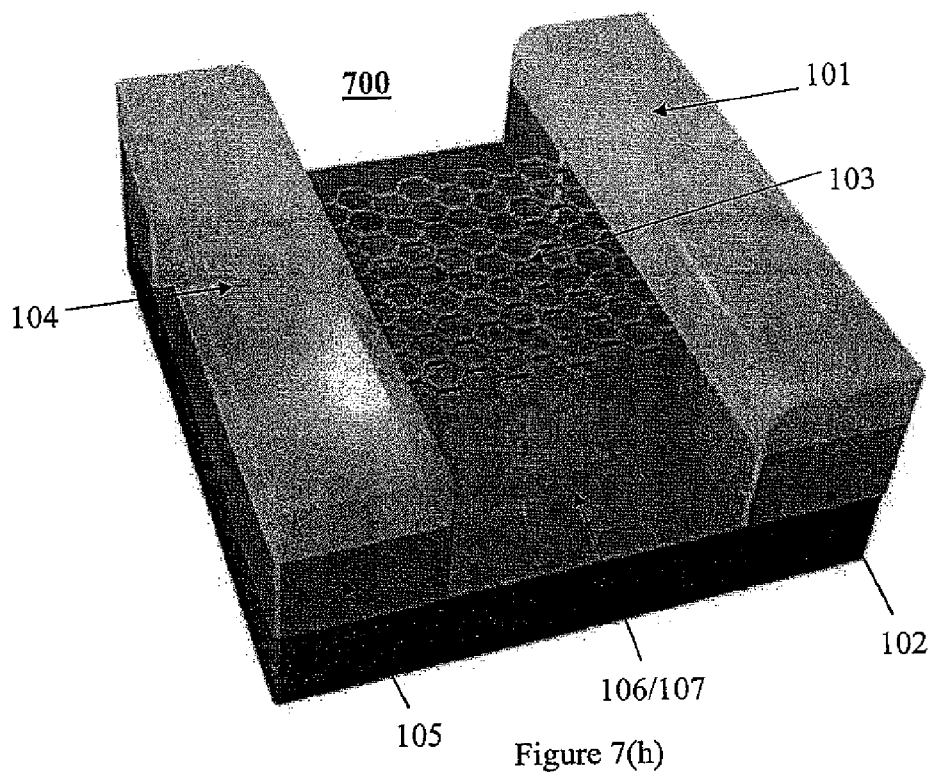
FIG. 7(h) illustrates a fabricated electromechanical device in accordance with an exemplary embodiment of the disclosed subject matter.

FIG. 7(f) is a side-view scanning electron microscope image of the fabricated electromechanical device located at point A in FIG. 7(e). As shown in FIG. 7(f), device 700 includes first and second electrodes 101, 104, a suspended graphene nano-ribbon 106 having dimensions 150 nm wide and approximately 1.7 µm long and a global gate electrode 106/107 comprising the silicon substrate upon with the device 700 was formed. FIG. 7(g) is a side-view scanning electron microscope image of the fabricated electromechanical device located at point B in FIG. 7(e). As shown in FIG. 7(g), and similar to FIG. 7(f), device 700 includes first and second electrodes 101, 104, a suspended graphene nano-ribbon 106 having dimensions 150 nm wide and approximately 1.7 µm long and a global gate electrode 106/107 comprising the silicon substrate upon with the device 700 was formed. FIG. 7(h) is a rendering of fabricated device 700 illustrating first and second electrodes 101, 104 and graphene layer 103 over the substrate 106/107 and further illustrating supporting members 102, 105.

Figure 8A:
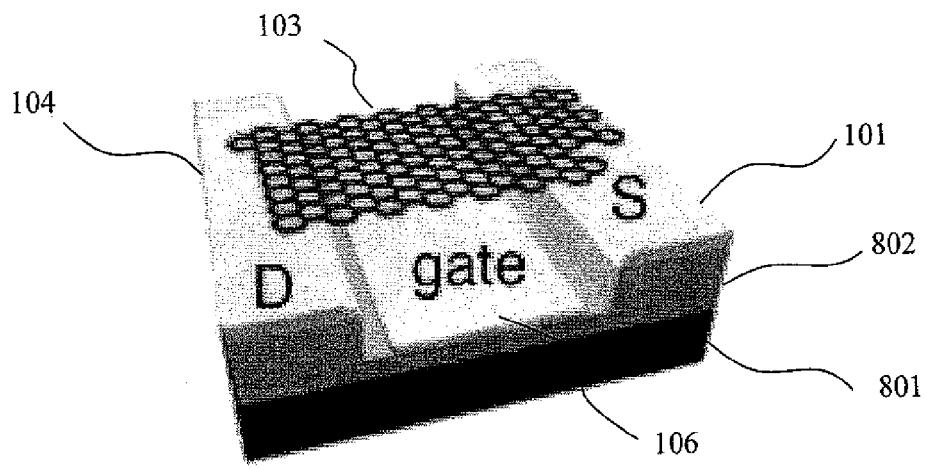
FIG. 8(a) illustrates a perspective view of a configurations of a fabricated electromechanical device in accordance with one embodiment of the disclosed subject matter.
Figure 8B:
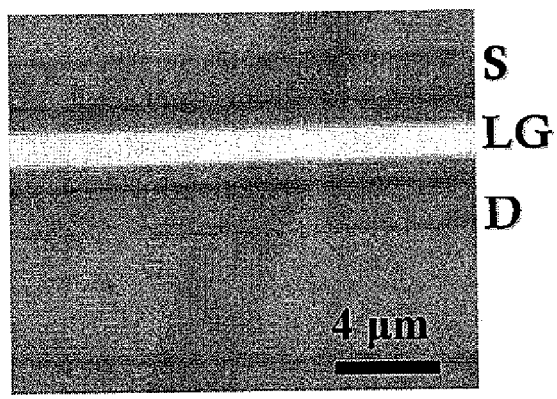
FIG. 8(b)-(c) are SEM micrographs of a fabricated electromechanical device as illustrated in FIG. 8(a).
Figure 8C:
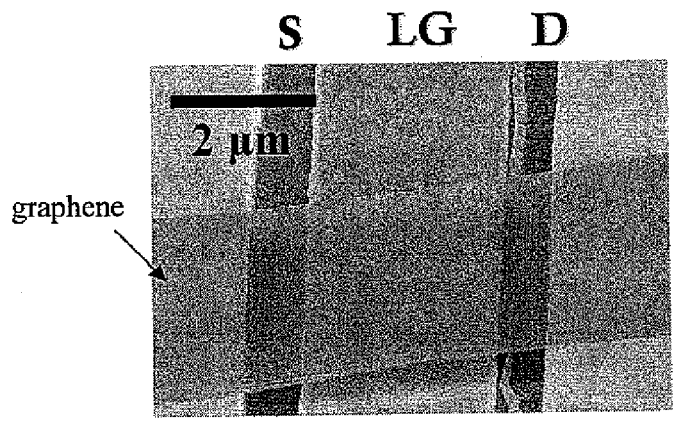

As has been illustrated above in connection with FIGS. 5-6 that graphene can be suspended underneath the first and second electrodes. Alternatively, graphene can be laid on top of the first and second electrodes, as illustrated in FIG. 8(a). In this configuration, the contact between the graphene and the two electrodes can be provided by short-range attractive forces between the graphene and the electrodes, for example, van der Waals forces. To fabricate a device having this configuration, the procedures described above in connection with FIGS. 5-6 can be slightly modified. For example, instead of depositing the graphene on the etchable material and then depositing the two electrodes on the etchable material and each covering a portion the graphene, the two electrodes 101 and 104 can be deposited on the etchable material 802 (which has been deposited on the substrate 801), and then the graphene 103 can be deposited on the top of the two electrodes to span the two electrodes. The third electrode 106 can be introduced by either of the procedures described in connection with FIGS. 5-6. FIGS. 8(b) and 8(c) depict SEM micrographs of a device according to the embodiment illustrated in FIG. 8(a).

It will be understood that the foregoing is only illustrative of the principles described herein, and that various modifications can be made by those skilled in the art without departing from the scope and spirit of the disclosed subject matter. For example, the methods described herein are used for fabricating electromechanical devices utilizing graphene. It is understood that that techniques described herein are useful for fabricating electromechanical devices with other high-transconductance materials. Moreover, features of embodiments described herein can be combined and/or rearranged to create new embodiments.

We claim:

1. A fabricated electromechanical device comprising:
   a substrate;
   one or more layers of a high-transconductance material separated from the substrate by a dielectric medium;
   a first electrode in electrical contact with the one or more layers of a high-transconductance material and separated from the substrate by at least one first supporting member;
   a second electrode in electrical contact with the one or more layers of a high-transconductance material and separated from the substrate by at least one second supporting member, wherein the first electrode is electrically separate from the second electrode; and
   a third electrode separated from the one or more layers of high-transconductance material by the dielectric medium and separated from each of the first electrode and the second electrode by the dielectric medium;

wherein, when a voltage is applied to at least one of the first electrode and the second electrode within a range of a resonance frequency of the high-transconductance material, the high-transconductance material provides a self-sustaining oscillating signal to the third electrode.

2. The fabricated electromechanical device of claim 1, wherein the substrate comprises of the third electrode.

3. The fabricated electromechanical device of claim 1, wherein the third electrode comprises a localized electrode deposited on the substrate.

4. The fabricated electromechanical device of claim 1, wherein the third electrode comprises a localized electrode submerged into the substrate.

5. The fabricated electromechanical device of claim 1, wherein the high-transconductance material comprises graphene.

6. The fabricated electromechanical device of claim 1, wherein the dielectric medium comprises air or a vacuum.

7. The fabricated electromechanical device of claim 1, wherein the substrate comprises silicon.

8. The fabricated electromechanical device of claim 1, wherein the first, second or third electrodes comprise metal electrodes.

9. The fabricated electromechanical device of claim 8, wherein the metal electrodes comprise gold electrodes.

10. The fabricated electromechanical device of claim 1, wherein the at least one first supporting member or the at least one second supporting member comprises of silicon dioxide.

11. The fabricated electromechanical device of claim 1, further comprising circuitry which comprises of:
a first voltage source electrically connected to a power splitter;
a first capacitor electrically connected between the power splitter and the second electrode;
a second voltage source electrically connected between the first capacitor and the second electrode;
a first current amplifier electrically connected to the first electrode;
a second current amplifier electrically connected to the first current amplifier;
a frequency mixer electrically connected to the second current amplifier and the power splitter;
a second capacitor electrically connected between the high frequency mixer and the third electrode; and
a third voltage source electrically connected between the second capacitor and the third electrode.

12. The fabricated electromechanical device of claim 11, further comprising:
a third capacitor electrically connected between the second voltage source and the second electrode;
a fourth capacitor electrically connected between the first electrode and the current amplifier; and
a fifth capacitor electrically connected between the third voltage source and the third electrode.

13. The fabricated electromechanical device of claim 11, further comprising:
a first inductor electrically connected between the second voltage source and the second electrode; and
a second inductor electrically connected between the third voltage source and the third electrode.

14. The fabricated electromechanical device of claim 11, wherein the second current amplifier is operable to provide an output.

15. A fabricated electromechanical device comprising:
a substrate;
one or more layers of a high-transconductance material separated from the substrate by a dielectric medium;
a first electrode in electrical contact with the one or more layers of a high-transconductance material and separated from the substrate by at least one first supporting member;
a second electrode in electrical contact with the one or more layers of a high-transconductance material and separated from the substrate by at least one second supporting member, wherein the first electrode is electrically separate from the second electrode;
a third electrode separated from the one or more layers of high-transconductance material by the dielectric medium and separated from each of the first electrode and the second electrode by the dielectric medium; and
circuitry comprising:
a first voltage source electrically connected to the first electrode;
a second voltage source electrically connected to the second electrode;
a third voltage source electrically connected to the third electrode;
wherein the first voltage source is electrically connected to the third voltage source; and
a first capacitor electrically connected between the first voltage and the third voltage source.

16. The fabricated electromechanical device of claim 15, further comprising
a first inductor electrically connected between the first voltage source and the first electrode;
a second inductor electrically connected between the second voltage source and the second electrodes; and
a third inductor electrically connected between the third voltage source and the third electrode.

17. The fabricated electromechanical device of claim 15, further comprising a second capacitor electrically connected between the second voltage source and the second electrode and further electrically connected to a ground.

18. The fabricated electromechanical device of claim 15, further comprising a third capacitor connected between the first voltage source and the first electrode, wherein the third capacitor is further electrically connected, in series, to a first resistor and a ground.

19. The fabricated electromechanical device of claim 15, further comprising a second resistor electrically connected between the first capacitor and the third electrode and further electrically connected to a ground.

20. The fabricated electromechanical device of claim 15, further comprising a directional coupler electrically connected between the first capacitor and the third electrode and further electrically connected to an electrical reading device.

21. The fabricated electromechanical device of claim 15, further comprising an amplifier electrically connected between the first capacitor and the third electrode.

22. The fabricated electromechanical device of claim 15, further comprising a phase shifter electrically connected between the first capacitor and the third electrode.

* * * * *